US006689477B2

(12) United States Patent
Inoue

(10) Patent No.: US 6,689,477 B2
(45) Date of Patent: Feb. 10, 2004

(54) TARGET FOR TRANSPARENT ELECTROCONDUCTIVE FILM, TRANSPARENT ELECTROCONDUCTIVE MATERIAL, TRANSPARENT ELECTROCONDUCTIVE GLASS AND TRANSPARENT ELECTROCONDUCTIVE FILM

(75) Inventor: Kazuyoshi Inoue, Tokyo (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 10/302,928

(22) Filed: Nov. 25, 2002

(65) Prior Publication Data

US 2003/0148871 A1 Aug. 7, 2003

Related U.S. Application Data

(63) Continuation of application No. 09/529,416, filed as application No. PCT/JP99/04453 on Aug. 19, 1999, now Pat. No. 6,534,183.

(30) Foreign Application Priority Data

| Aug. 31, 1998 | (JP) | ............................................ | 10-245322 |
| Sep. 4, 1998 | (JP) | ............................................ | 10-251200 |
| Jan. 12, 1999 | (JP) | ............................................ | 11-005046 |
| Mar. 5, 1999 | (JP) | ............................................ | 11-058384 |

(51) Int. Cl.$^7$ .............................................. B32B 17/06
(52) U.S. Cl. ........................ 428/432; 428/689; 428/697
(58) Field of Search ................................ 428/457, 469, 428/688, 689, 697, 699, 702, 544, 546, 548; 501/10

(56) References Cited

U.S. PATENT DOCUMENTS 5,763,091 A * 6/1998 Kawata et al. ............... 428/428
5,972,527 A * 10/1999 Kaijou et al. ............... 428/697

FOREIGN PATENT DOCUMENTS

WO    WO 9701853    1/1997

* cited by examiner

Primary Examiner—Deborah Jones
Assistant Examiner—Arden Sperty
(74) Attorney, Agent, or Firm—Oblon, Spivak, McClelland, Maier & Neustadt, P.C.

(57) ABSTRACT

The invention includes sintered products for transparent electroconductive films, which are formed into films in a stable and efficient manner through sputtering or the like, sputtering targets of the sintered products, and transparent electroconductive glass and films formed from the targets. The transparent electroconductive glass and films have good transparency, good electroconductivity and good workability into electrodes, and are therefore favorable to transparent electrodes in organic electroluminescent devices as realizing good hole injection efficiency therein. The sintered products contain constituent components of indium oxide, tin oxide and zinc oxide in specific atomic ratios of the metal atoms, and optionally contain specific metal oxides of ruthenium oxide, molybdenum oxide, vanadium oxide, etc.

23 Claims, No Drawings

TARGET FOR TRANSPARENT ELECTROCONDUCTIVE FILM, TRANSPARENT ELECTROCONDUCTIVE MATERIAL, TRANSPARENT ELECTROCONDUCTIVE GLASS AND TRANSPARENT ELECTROCONDUCTIVE FILM

This application is a continuation of application Ser. No. 09/529,416 filed on May 1, 2000, now U.S. Pat. No. 6,534,183 which is a 371 of International Application No. PCT/JP99/04453, filed Aug. 19, 1999.

TECHNICAL FIELD

The present invention relates to sintered metal oxides of great use as blanks for transparent electroconductive films for display devices and others, to targets of the sintered products for forming transparent electroconductive films, to transparent electroconductive materials, and to transparent electroconductive glass and films formed from the targets.

BACKGROUND ART

Recently, various display devices such as liquid-crystal displays, electroluminescent displays, field emission displays and others have been introduced into office appliances and also control systems in factories. These devices all have a sandwich structure with a display member put between transparent electroconductive films.

For the transparent electroconductive films, much used is indium oxide-tin oxide (hereinafter referred to as ITO) to give ITO films. The ITO films are highly transparent and have low electric resistance, and, in addition, they are well etched and their adhesiveness to substrates is good. As having such good properties, the ITO films are widely used in the art. In general, the ITO films are formed in various methods of sputtering, ion-plating, vapor deposition, etc.

Though having such good properties, however, there still remain some problems to be solved with the ITO films when they are used, for example, as transparent electrodes for liquid-crystal display devices. The problems with the ITO films include their surface accuracy, the tapering processability of electrodes made of them, and their workability into electrodes with junctions or contact points.

Specifically, ITO itself is a crystalline metal oxide, and its crystal grains grow in the step of forming it into films. The growing crystal grains deposit on the surface of the ITO film, thereby lowering the surface accuracy of the film. In the step of etching the ITO film for forming an electrode, the intergranular boundaries in the film are first etched, and the etched surface of the electrode shall be roughened. Therefore, it is difficult to etch the ITO film with accuracy. Further, in the step of tapering the ITO film electrode, the intergranular boundaries in the film are also first etched, and the ITO grains will often remain in the etched area. In that condition, the ITO film electrode could not be well insulated from the counter electrode, thereby often causing display failure.

To solve the problem, a transparent electroconductive material comprising indium oxide and zinc oxide was proposed, for example, in Japanese Patent Laid-Open No. 234565/1994. Its workability into electrodes was improved without its transparency and electroconductivity being not sacrificed. However, the indium oxide-zinc oxide material has a bulk resistance of from 2 to 5 mΩ.cm, and the electric power to be applied thereto for forming it into films is limited. Therefore, the problem with the material is that the productivity in forming it into films is low.

In an organic electroluminescent device having a film electrode of ITO, holes must be transferred from the ITO film electrode into the light emission layer or into the hole transporting layer. For this, it is desirable that the work function of the electrode material and that of the organic compound for the light emission layer or the hole transporting layer are nearly on the same level and that the energy gap between the anode and the hole transporting layer is as small as possible. To reduce the energy gap, the difference between the work function of the anode material and the ionization potential of the organic compound for the hole transporting layer must be reduced. Various organic compounds have been proposed for hole-transporting substances usable for forming the hole transporting layer. Of those, aromatic amine compounds, especially triphenylamine derivatives have been known to have good capabilities. Triphenylamine, one of triphenylamine derivatives, has an ionization potential of from 5.5 to 5.6 electron volts. On the other hand, for transparent electroconductive films, well known is indium oxide-tin oxide (hereinafter referred to as ITO) having high transparency and low electric resistance. The work function of ITO is 4.6 electron volts. Accordingly, there shall be a relatively large energy gap between the anode and the electron transportation layer both of such ordinary materials.

In that situation, proposed was an organic, light-emitting thin-film device having an organic compound layer between an anode and a cathode, for example, in Japanese Patent Laid-Open No. 63771/1997. In this, the anode is of a thin film of a metal oxide of which the work function is larger than that of ITO. However, the thin-film anode of such a metal oxide has a light transmittance of 10% when the metal oxide is ruthenium oxide, and 20% when it is vanadium oxide. To increase the light transmittance, proposed was a two-layered structure composed of an ITO film and an ultra-thin film of the metal oxide, the ultra-thin film having a thickness of not larger than 300 angstroms. Even in this case, however, the light transmittance of the two-layered structure is still 40 to 60% or so. Therefore, the two-layered structure is still problematic in that its transparency is not satisfactory for transparent electrodes for display devices.

DISCLOSURE OF THE INVENTION

The present invention is to provide sintered metal oxides capable of being formed into films in a stable and efficient manner through sputtering or the like, targets of the sintered products, and transparent electroconductive glass and films formed from the targets. The transparent electroconductive glass and films have good transparency, good electroconductivity and good workability into electrodes, and when they are formed into transparent electrodes and used in organic electroluminescent devices, the difference between their work function and the ionization potential of the hole-transporting substances in the devices is small and therefore the transparent electrodes do not lower the light emission efficiency of the devices.

Having assiduously studied so as to solve the problems noted above, we, the present inventors have found that using sintered products of compounds, which comprise indium oxide, tin oxide and zinc oxide in a specific ratio, as transparent electroconductive materials solves the problems. On the basis of this finding, we have completed the present invention.

Specifically, the invention includes first to fourth aspects, which are summarized as follows:

[I] First Aspect of the Invention

[1] A sintered product that comprises constituent components of indium oxide, tin oxide and zinc oxide in the following atomic ratios:

In/(In+Sn+Zn)=0.50 to 0.75,

Sn/(In+Sn+Zn)=0.20 to 0.45,

Zn/(In+Sn+Zn)=0.03 to 0.30, and contains a hexagonal layer compound of $In_2O_3 \cdot (ZnO)m$ with m indicating an integer of from 2 to 20, and a spinel-structured compound of $Zn_2SnO_4$.

[2] The sintered product of above [1], which has a specific resistance of smaller than 2 mΩ.cm.

[3] A sintered product that comprises constituent components of indium oxide, tin oxide and zinc oxide in the following atomic ratios:

In/(In+Sn+Zn)=0.50 to 0.75,

Sn/(In+Sn+Zn)=0.20 to 0.45,

Zn/(In+Sn+Zn)=0.03 to 0.30, and from 0.5 to 10 atomic %, relative to the total of all metal atoms therein, of an oxide of a positive tetra-valent or higher poly-valent metal, and contains a hexagonal layer compound of $In_2O_3 \cdot (ZnO)m$ with m indicating an integer of from 2 to 20, and a spinel-structured compound of $Zn_2SnO_4$.

[4] The sintered product of above [3], in which the oxide of a positive tetra-valent or higher poly-valent metal is ruthenium oxide, molybdenum oxide or vanadium oxide.

[5] A sputtering target for transparent electroconductive films, which comprises the sintered product of any of above [1] to [4].

[6] An electron-beaming target for transparent electroconductive films, which comprises the sintered product of any of above [1] to [4].

[7] An ion-plating target for transparent electroconductive films, which comprises the sintered product of any of above [1] to [4].

[8] Transparent electroconductive glass prepared by coating the surface of glass with an amorphous transparent electroconductive film that comprises constituent components of indium oxide, tin oxide and zinc oxide in the following atomic ratios:

In/(In+Sn+Zn)=0.50 to 0.75,

Sn/(In+Sn+Zn)=0.20 to 0.45,

Zn/(In+Sn+Zn)=0.03 to 0.30, and contains from 0.5 to 10 atomic %, relative to the total of all metal atoms therein, of an oxide of a positive tetra-valent or higher poly-valent metal.

[9] The transparent electroconductive glass of above [8], in which the oxide of a positive tetra-valent or higher poly-valent metal is ruthenium oxide, molybdenum oxide or vanadium oxide.

[10] The transparent electroconductive glass of above [8] or [9], which has a light transmittance of at least 75% and a specific resistance of at most 5 mΩ.cm, and in which the transparent electroconductive film has a work function of at least 5.45.

[11] A transparent electroconductive film prepared by coating the surface of a transparent resin film with an amorphous transparent electroconductive layer that comprises constituent components of indium oxide, tin oxide and zinc oxide in the following atomic ratios:

In/(In+Sn+Zn)=0.50 to 0.75,

Sn/(In+Sn+Zn)=0.20 to 0.45,

Zn/(In+Sn+Zn)=0.03 to 0.30, and contains from 0.5 to 10 atomic %, relative to the total of all metal atoms therein, of an oxide of a positive tetra-valent or higher poly-valent metal.

[12] The transparent electroconductive film of above [11], in which the oxide of a positive tetra-valent or higher poly-valent metal is ruthenium oxide, molybdenum oxide or vanadium oxide.

[13] The transparent electroconductive film of above [11] or [12], which has a light transmittance of at least 75% and a specific resistance of at most 5 mΩ.cm, and in which the transparent electroconductive layer has a work function of at least 5.45.

[II] Second Aspect of the Invention

[1] A sintered product of a composition that comprises indium oxide, or indium oxide and zinc oxide and/or tin oxide in the following atomic ratios:

In/(In+Zn+Sn)=0.80 to 1.00,

Zn/(In+Zn+Sn)=0.00 to 0.20,

Sn/(In+Zn+Sn)=0.00 to 0.20, and contains from 0.5 to 10 atomic %, relative to the total of all metal atoms therein, of a metal oxide selected from ruthenium oxide, molybdenum oxide and vanadium oxide.

[2] A sintered product of a composition that comprises indium oxide and zinc oxide, or tin oxide in addition to the former two oxides in the following atomic ratios:

In/(In+Zn+Sn)=0.80 to 1.00,

Zn/(In+Zn+Sn)=0.05 to 0.20,

Sn/(In+Zn+Sn)=0.00 to 0.20, and contains from 0.5 to 10 atomic %, relative to the total of all metal atoms therein, of a metal oxide selected from ruthenium oxide, molybdenum oxide and vanadium oxide.

[3] A sintered product of a composition that comprises indium oxide, zinc oxide and tin oxide in the following atomic ratios:

In/(In+Zn+Sn)=0.80 to 1.00,

Zn/(In+Zn+Sn)=0.05 to 0.20,

Sn/(In+Zn+Sn)=0.02 to 0.20, and contains from 0.5 to 10 atomic %, relative to the total of all metal atoms therein, of a metal oxide selected from ruthenium oxide, molybdenum oxide and vanadium oxide.

[4] A sputtering target comprising the sintered product of any of above [1] to [3].

[5] An electron-beaming target comprising the sintered product of any of above [1] to [3].

[6] An ion-plating target comprising the sintered product of any of above [1] to [3].

[7] Transparent electroconductive glass prepared by coating the surface of glass with a transparent electroconductive film of a composition that comprises indium oxide, zinc oxide and tin oxide in the following atomic ratios:

In/(In+Zn+Sn)=0.80 to 1.00,

Zn/(In+Zn+Sn)=0.00 to 0.20,

Sn/(In+Zn+Sn)=0.00 to 0.20, and contains from 0.5 to 10 atomic %, relative to the total of all metal atoms therein, of a metal oxide selected from ruthenium oxide, molybdenum oxide and vanadium oxide.

[8] The transparent electroconductive glass of above [7], which has a light transmittance of at least 75% and a specific resistance of at most 5 mΩ.cm, and in which the transparent electroconductive film has a work function of at least 5.45 electron volts.

[9] A transparent electroconductive film prepared by coating the surface of a transparent resin film with a transparent electroconductive layer that comprises indium oxide, zinc oxide and tin oxide in the following atomic ratios:

In/(In+Zn+Sn)=0.80 to 1.00,

Zn/(In+Zn+Sn)=0.00 to 0.20,

Sn/(In+Zn+Sn)=0.00 to 0.20, and contains from 0.5 to 10 atomic %, relative to the total of all metal atoms therein, of a metal oxide selected from ruthenium oxide, molybdenum oxide and vanadium oxide.

[10] The transparent electroconductive film of above [9], which has a light transmittance of at least 75% and a specific resistance of at most 5 mΩ.cm, and in which the transparent electroconductive layer has a work function of at least 5.45 electron volts.

[III] Third Aspect of the Invention

[1] A transparent electroconductive material of a composition that comprises one or more metal oxides selected from indium oxide, zinc oxide and tin oxide and contains from 0.5 to 20 atomic %, relative to the total of all metal atoms therein, of one or more metal oxides selected from iridium oxide, rhenium oxide and palladium oxide.

[2] A transparent electroconductive material of a composition that comprises metal oxide(s) of indium oxide, zinc oxide and tin oxide in the following atomic ratios:

In/(In+Zn+Sn)=0.00 to 1.00,

Zn/(In+Zn+Sn)=0.00 to 0.25,

Sn/(In+Zn+Sn)=0.00 to 1.00, and contains from 0.5 to 20 atomic %, relative to the total of all metal atoms therein, of one or more metal oxides selected from iridium oxide, rhenium oxide and palladium oxide.

[3] A transparent electroconductive material of a composition that comprises metal oxides of indium oxide, zinc oxide and tin oxide in the following atomic ratios:

In/(In+Zn+Sn)=0.50 to 1.00,

Zn/(In+Zn+Sn)=0.05 to 0.25,

Sn/(In+Zn+Sn)=0.00 to 0.50, and contains from 0.5 to 20 atomic %, relative to the total of all metal atoms therein, of one or more metal oxides selected from iridium oxide, rhenium oxide and palladium oxide.

[4] A transparent electroconductive material of a composition that comprises metal oxides of indium oxide, zinc oxide and tin oxide in the following atomic ratios:

In/(In+Zn+Sn)=0.75 to 0.95,

Zn/(In+Zn+Sn)=0.05 to 0.20,

Sn/(In+Zn+Sn)=0.00 to 0.20, and contains from 0.5 to 20 atomic %, relative to the total of all metal atoms therein, of one or more metal oxides selected from iridium oxide, rhenium oxide and palladium oxide.

[5] A sintered product prepared by sintering the composition of any of above [1] to [4].

[6] A sputtering target comprising the sintered product of above [5].

[7] Transparent electroconductive glass prepared by coating the surface of glass with a transparent electroconductive film of a composition that comprises one or more metal oxides selected from indium oxide, zinc oxide and tin oxide and contains from 0.5 to 20 atomic %, relative to the total of all metal atoms therein, of one or more metal oxides selected from iridium oxide, rhenium oxide and palladium oxide.

[8] The transparent electroconductive glass of above [7], which has a light transmittance of at least 70% and in which the transparent electroconductive film has a work function of at least 5.4 electron volts.

[9] A transparent electroconductive film prepared by coating the surface of a transparent resin film with a transparent electroconductive layer that comprises one or more metal oxides selected from indium oxide, zinc oxide and tin oxide and contains from 0.5 to 20 atomic %, relative to the total of all metal atoms therein, of one or more metal oxides selected from iridium oxide, rhenium oxide and palladium oxide.

[10] The transparent electroconductive film of above [9], which has a light transmittance of at least 70% and in which the transparent electroconductive layer has a work function of at least 5.4 electron volts.

Fourth Aspect of the Invention [1] A transparent electroconductive material of a composition that comprises metal oxide(s) of tin oxide, indium oxide and zinc oxide in the following atomic ratios:

Sn/(Sn+In+Zn)=0.55 to 1.00,

In/(Sn+In+Zn)=0.00 to 0.45,

Zn/(Sn+In+Zn)=0.00 to 0.25, and contains from 0.5 to 10 atomic %, relative to the total of all metal atoms therein, of one or more metal oxides selected from vanadium oxide, molybdenum oxide and ruthenium oxide.

[2] The transparent electroconductive material of above [1], in which tin oxide, indium oxide and zinc oxide are in the following atomic ratios:

Sn/(Sn+In+Zn)=0.55 to 0.95,

In/(Sn+In+Zn)=0.00 to 0.40,

Zn/(Sn+In+Zn)=0.05 to 0.25.

[3] The transparent electroconductive material of above [1], in which tin oxide, indium oxide and zinc oxide are in the following atomic ratios:

Sn/(Sn+In+Zn)=0.55 to 0.95,

In/(Sn+In+Zn)=0.00 to 0.40,

Zn/(Sn+In+Zn)=0.05 to 0.20.

[4] The transparent electroconductive material of above [1], in which tin oxide, indium oxide and zinc oxide are in the following atomic ratios:

Sn/(Sn+In+Zn)=0.60 to 0.95,

In/(Sn+In+Zn)=0.00 to 0.35,

Zn/(Sn+In+Zn)=0.05 to 0.20.

[5] A sintered product prepared by sintering the composition of any of above [1] to [4] at a temperature of not lower than 1200° C.

[6] A sputtering target comprising the sintered product of above [5], which has a specific resistance of at most 10 mΩ.cm.

[7] Transparent electroconductive glass prepared by forming, on the surface of a glass substrate, a transparent electroconductive film of a composition that comprises metal oxide(s) of tin oxide, indium oxide and zinc oxide in the following atomic ratios:

Sn/(Sn+In+Zn)=0.55 to 1.00,

In/(Sn+In+Zn)=0.00 to 0.45,

Zn/(Sn+In+Zn)=0.00 to 0.25, and contains from 0.5 to 10 atomic %, relative to the total of all metal atoms therein, of one or more metal oxides selected from vanadium oxide, molybdenum oxide and ruthenium oxide.

[8] The transparent electroconductive glass of above [7], in which the transparent electroconductive film has a light transmittance of at least 70% and a work function of at least 5.4 electron volts.

[9] A transparent electroconductive film prepared by forming, on the surface of a transparent resin film, a transparent electroconductive layer of a composition that comprises metal oxide(s) of tin oxide, indium oxide and zinc oxide in the following atomic ratios:

Sn/(Sn+In+Zn)=0.55 to 1.00,

In/(Sn+In+Zn)=0.00 to 0.45,

Zn/(Sn+In+Zn)=0.00 to 0.25, and contains from 0.5 to 10 atomic %, relative to the total of all metal atoms therein, of one or more metal oxides selected from vanadium oxide, molybdenum oxide and ruthenium oxide.

[10] The transparent electroconductive film of above [9], in which the transparent electroconductive layer has a light transmittance of at least 70% and a work function of at least 5.4 electron volts.

BEST MODES OF CARRYING OUT THE INVENTION

Embodiments of the invention are described below.
First Aspect of the Invention

The sintered product of the invention is a transparent electroconductive material for forming transparent electroconductive films, and its basic constituent components are indium oxide, tin oxide and zinc oxide.

In this, the constituent components are in the following atomic ratios:

In/(In+Sn+Zn)=0.50 to 0.75,

Sn/(In+Sn+Zn)=0.20 to 0.45,

Zn/(In+Sn+Zn)=0.03 to 0.30, preferably,

In/(In+Sn+Zn)=0.60 to 0.75,

Sn/(In+Sn+Zn)=0.20 to 0.35,

Zn/(In+Sn+Zn)=0.05 to 0.20, more preferably,

In/(In+Sn+Zn)=0.60 to 0.70,

Sn/(In+Sn+Zn)=0.25 to 0.35,

Zn/(In+Sn+Zn)=0.05 to 0.15.

In the invention, the composition of the constituent components, indium oxide, tin oxide and zinc oxide is defined as above. This is because when a mixture of indium oxide and zinc oxide is baked at low temperatures, the electroconductivity of the resulting sintered product is low. In the invention, the reduction in the electroconductivity of the sintered product is prevented. When the mixture of indium oxide and zinc oxide is baked at high temperatures, the resulting sintered product could be a hexagonal layer compound with increased electroconductivity. In the mixture, however, it is difficult to convert zinc oxide entirely into a hexagonal layer compound, and the increase in the electroconductivity of the sintered product is limited. Accordingly, in the invention, zinc oxide that could not be converted into a hexagonal layer compound is reacted with tin oxide to form a spinel-structured compound, whereby the electroconductivity of the sintered product of the composition is increased and the sputtering stability of targets of the sintered product is ensured.

Regarding the blend ratio of these components, if the atomic ratio of indium oxide is smaller than 0.50, the surface resistance of the transparent electroconductive film to be obtained herein will be high and the heat resistance thereof will be low; but if larger than 0.75, the transparent electroconductive film will crystallize to lower its transparency. If the atomic ratio of tin oxide is smaller than 0.20, forming the spinel-structured compound of zinc oxide and tin oxide will be incomplete; but if larger than 0.45, the surface resistance of the transparent electroconductive film will be high. If the atomic ratio of zinc oxide is smaller than 0.03, the transparent electroconductive film will readily crystallize; but if larger than 0.30, the heat resistance of the film will be low.

The sintered product comprises the constituent metal oxides of which the composition falls within the defined range as above, and contains a hexagonal layer compound of $In_2O_3 \cdot (ZnO)m$ with m indicating an integer of from 2 to 20, and a spinel-structured compound of $Zn_2SnO_4$.

The sintered product of the invention that comprises the constituent components as above has high electroconductivity as so mentioned hereinabove, and its specific resistance is lower than 2 mΩ.cm. Accordingly, when a target of the sintered product is sputtered to form a film in a sputtering device, the sputtering stability is good and the productivity in producing the film product is good.

The sintered product that comprises the constituent components, indium oxide, tin oxide and zinc oxide, and additionally contains from 0.5 to 10 atomic %, relative to the total of all metal atoms therein, an oxide of a positive tetra-valent or higher poly-valent metal, especially preferably ruthenium oxide, molybdenum oxide or vanadium oxide has a work function falling between 5.45 and 5.70 electron volts, and its work function is nearly on the same level as the average work function, 5.6 electron volts, of organic compounds for light-emitting substances or hole-transporting substances for organic electroluminescent devices. Accordingly, transparent electroconductive films formed by sputtering a target of the sintered product shall have high hole injection efficiency when used in organic electroluminescent devices. In the sintered product, the proportion of the oxide of a positive tetra-valent or higher poly-valent metal preferably falls between 1 and 5 atomic % to the total of all metal atoms.

For producing the sintered product of the invention, for example, employed is a method comprising uniformly mixing and grinding powders of starting metal oxides in a mixing and grinding machine, for example, in a wet ball or bead mill or ultrasonically, then granulating the resulting mixture, shaping the resulting granules into bodies of desired form by pressing, and finally baking them into sintered products. In this, the raw material powders are preferably mixed and ground as fine as possible, but, in general, they are mixed and ground to have a mean grain size of not larger than 1 μm. In the baking step, the shaped bodies are baked generally at a temperature falling between 1,200 and 1,500° C., but preferably between 1,250 and 1,480° C., for a period of time generally falling between 10 and 72 hours, but preferably between 24 and 48 hours. In this, the heating rate may fall between 1 and 50° C./min.

In the baking step, the baking temperature is preferably not lower than 1,250° C. in order that indium oxide and zinc oxide in the resulting sintered product could form a hexagonal layer compound of the formula noted above. The baking temperature shall be at lowest 1,000° C. in order that zinc oxide and tin oxide could form a spinel-structured compound.

Where the three-component system of the metal oxides is combined with an oxide of a positive tetra-valent or higher poly-valent metal, such as ruthenium oxide, molybdenum oxide or vanadium oxide in preparing the sintered product of the invention, a suitable amount of powder of the additional metal oxide such as ruthenium oxide is added to the powders of the starting, three-component system metal oxides, and baked in the same manner as above. Also in this case, baking the shaped bodies is effected under the condition under which the hexagonal layer compound of indium oxide and zinc oxide and the spinel-structured compound of zinc oxide and tin oxide could be formed in the resulting sintered product.

[II] Second Aspect of the Invention

The sintered product of the invention for forming transparent electroconductive films is of a composition that comprises indium oxide, or indium oxide and zinc oxide and/or tin oxide in the following atomic ratios:

In/(In+Zn+Sn)=0.80 to 1.00,

Zn/(In+Zn+Sn)=0.00 to 0.20,

Sn/(In+Zn+Sn)=0.00 to 0.20, and contains from 0.5 to 10 atomic %, relative to the total of all metal atoms therein, of a metal oxide selected from ruthenium oxide, molybdenum oxide and vanadium oxide.

More preferably, the sintered product is of a composition that comprises indium oxide and zinc oxide, or tin oxide in addition to the former two oxides in the following atomic ratios:

In/(In+Zn+Sn)=0.80 to 1.00,

Zn/(In+Zn+Sn)=0.05 to 0.20,

Sn/(In+Zn+Sn)=0.00 to 0.20, and contains from 0.5 to 10 atomic %, relative to the total of all metal atoms therein, of a metal oxide selected from ruthenium oxide, molybdenum oxide and vanadium oxide.

Most preferably, the sintered product is of a composition that comprises indium oxide, zinc oxide and tin oxide in the following atomic ratios:

In/(In+Zn+Sn)=0.80 to 1.00,

Zn/(In+Zn+Sn)=0.05 to 0.20,

Sn/(In+Zn+Sn)=0.02 to 0.20, and contains from 0.5 to 10 atomic %, relative to the total of all metal atoms therein, of a metal oxide selected from ruthenium oxide, molybdenum oxide and vanadium oxide.

For the sintered product of the invention, the composition of the basic constituent components, indium oxide, tin oxide and zinc oxide, may be indium oxide alone, or a mixture of indium oxide and a small amount of zinc oxide, or a mixture of indium oxide, a small amount of zinc oxide and a small amount of tin oxide, as in the above.

Regarding the blend ratio of the constituent components, if the atomic ratio of indium oxide is smaller than 0.80, the surface resistance of the transparent electroconductive film to be obtained herein will be high and the heat resistance thereof will be low. If the atomic ratio of zinc oxide is smaller than 0.05, the transparent electroconductive film could not be etched satisfactorily. In this case, a small amount of water or hydrogen may be added to the system where the sintered product is sputtered to form films, whereby the etchability of the films formed could be improved. If the atomic ratio of zinc oxide is larger than 0.20, the electroconductivity of the transparent electroconductive film will be low. If the atomic ratio of tin oxide is smaller than 0.02, the electroconductivity of targets of the sintered product will be low; but if larger than 0.20, the surface resistance of the transparent electroconductive film formed will be high.

The sintered product comprises the basic constituent component, indium oxide alone, or indium oxide and zinc oxide and/or tin oxide, and contains from 0.5 to 10 atomic %, relative to the total of all metal atoms therein, an additional metal oxide selected from ruthenium oxide, molybdenum oxide and vanadium oxide. If the additional metal oxide content is smaller than 0.5 atomic %, the work function of the transparent electroconductive film to be obtained herein could not be increased to a satisfactory level; but if larger than 10 atomic %, the transparency of the film will be low. More preferably, the additional metal oxide content falls between 1 and 7 atomic %, even more preferably between 1 and 5 atomic %, relative to the total of all metal atoms in the composition.

The transparent electroconductive film from the sintered product that comprises the basic components of indium oxide and others and contains at least one additional component of ruthenium oxide, molybdenum oxide and vanadium oxide could have an increased work function of, for example, at least 5.45 electron volts when the proportion of the additional components falls within the defined range. The work function of the transparent electroconductive film is nearly on the same level as the average ionization potential, 5.5 to 5.6 electron volts, of organic compounds for light-emitting substances or hole-transporting substances for organic electroluminescent devices. Accordingly, when the transparent electroconductive film is used as the anode in an organic electroluminescent device, the energy gap in hole injection from the anode to the hole transportation layer or to the light-emitting layer in the device could be reduced, and therefore the device could ensure increased hole injection efficiency. As a result, the driving voltage for the organic electroluminescent device could be lowered, heat generation that may be caused by the energy gap between the constituent layers could be retarded in the device, and the device could ensure long-term stable light emission.

For producing the sintered product of the invention, for example, employed is a method comprising blending powders of the starting metal oxides in a predetermined ratio, uniformly mixing and grinding the blend in a mixing and grinding machine, for example, in a wet ball or bead mill or ultrasonically, then granulating the resulting mixture, shaping the resulting granules into bodies of desired form by pressing, and finally baking them into sintered products. In this, the raw material powders are preferably mixed and ground as fine as possible, but, in general, they are mixed and ground to have a mean grain size of not larger than 1 $\mu$m. In the baking step, the shaped bodies are baked generally at a temperature falling between 1,200 and 1,500° C., but preferably between 1,250 and 1,480° C., for a period of time generally falling between 10 and 72 hours, but preferably between 24 and 48 hours. In this, the heating rate may fall between 1 and 50° C./min.

[III] Third Aspect of the Invention

The transparent electroconductive material of the invention is of a composition that comprises one or more metal oxides selected from indium oxide, zinc oxide and tin oxide and contains from 0.5 to 20 atomic %, relative to the total of all metal atoms therein, of one or more metal oxides selected from iridium oxide, rhenium oxide and palladium oxide.

The transparent electroconductive material with better electroconductivity is of a composition that comprises metal oxide(s) of indium oxide, zinc oxide and tin oxide in the following atomic ratios:

In/(In+Zn+Sn)=0.00 to 1.00,

Zn/(In+Zn+Sn)=0.00 to 0.25,

Sn/(In+Zn+Sn)=0.00 to 1.00, and contains from 0.5 to 20 atomic %, relative to the total of all metal atoms therein, of one or more metal oxides selected from iridium oxide, rhenium oxide and palladium oxide.

More preferably, the transparent electroconductive material is of a composition that comprises metal oxides of indium oxide, zinc oxide and tin oxide in the following atomic ratios:

In/(In+Zn+Sn)=0.50 to 1.00,

Zn/(In+Zn+Sn)=0.05 to 0.25,

Sn/(In+Zn+Sn)=0.00 to 0.50, and contains from 0.5 to 20 atomic %, relative to the total of all metal atoms therein, of one or more metal oxides selected from iridium oxide, rhenium oxide and palladium oxide.

The transparent electroconductive material with much better electroconductivity is of a composition that comprises metal oxides of indium oxide, zinc oxide and tin oxide in the following atomic ratios:

In/(In+Zn+Sn)=0.75 to 0.95,

Zn/(In+Zn+Sn)=0.05 to 0.20,

Sn/(In+Zn+Sn)=0.00 to 0.20, and contains from 0.5 to 20 atomic %, relative to the total of all metal atoms therein, of one or more metal oxides selected from iridium oxide, rhenium oxide and palladium oxide.

Most preferably, the transparent electroconductive material is of a composition that comprises metal oxides of indium oxide, zinc oxide and tin oxide in the following atomic ratios:

In/(In+Zn+Sn)=0.85 to 0.95,

Zn/(In+Zn+Sn)=0.07 to 0.20,

Sn/(In+Zn+Sn)=0.00 to 0.15, and contains from 0.5 to 20 atomic %, relative to the total of all metal atoms therein, of one or more metal oxides selected from iridium oxide, rhenium oxide and palladium oxide.

For the transparent electroconductive material of the invention, the composition of the basic constituent components, indium oxide, zinc oxide and tin oxide, or a mixture of these metal oxides may be indium oxide, zinc oxide or tin oxide each alone, or a mixture of indium oxide and zinc oxide, or a mixture of indium oxide and tin oxide, or a mixture of indium oxide, zinc oxide and tin oxide, as in the above.

Regarding the blend ratio of the constituent components, indium oxide is not always needed herein. However, in order that the material could be formed into transparent electroconductive films with low surface resistance, it is desirable the atomic ratio of indium oxide is at least 0.5. Zinc oxide is not always needed herein. However, in order that the material could be formed into transparent electroconductive films with improved etchability, a small amount of zinc oxide is added to the composition for the material. For this, for example, the atomic ratio of zinc oxide may be at least 0.05. If the etchability of the transparent electroconductive films formed from the material is poor, a small amount of water or hydrogen may be added to the system where the sintered product of the material is sputtered to form the films, whereby the etchability of the films formed could be improved. If the atomic ratio of zinc oxide is larger than 0.25, the durability of the transparent electroconductive films will be low. Tin oxide is not always needed herein, but is preferably present in the material of the invention in order that targets formed from the material are desired to have high electroconductivity. However, when the transparent electroconductive films to be formed from the targets are desired to have low surface resistance, it is preferable that the atomic ratio of tin oxide is at most 0.5 in the material.

In the material, the basic constituent components shall be combined with any one of iridium oxide, rhenium oxide and palladium oxide or with a mixture of the metal oxides that may be in any desired ratio. The proportion of the additional metal oxides to be in the material shall fall between 0.5 and 20 atomic % relative to the total of all metal atoms constituting the material that includes the additional metal oxides. It may be given by the following formulae, in terms of the atomic ratio of the metals:

Ir/(In+Zn+Sn+Ir)=0.005 to 0.20,

Re/(In+Zn+Sn+Re)=0.005 to 0.20,

Pd/(In+Zn+Sn+Pd)=0.005 to 0.20, preferably,

Ir/(In+Zn+Sn+Ir)=0.01 to 0.10,

Re/(In+Zn+Sn+Re)=0.01 to 0.10,

Pd/(In+Zn+Sn+Pd)=0.01 to 0.10, more preferably,

Ir/(In+Zn+Sn+Ir)=0.03 to 0.08,

Re/(In+Zn+Sn+Re)=0.03 to 0.08,

Pd/(In+Zn+Sn+Pd)=0.03 to 0.08.

If the proportion of the additional components of iridium oxide, rhenium oxide and palladium oxide is smaller than 0.5 atomic %, the work function of the transparent electroconductive film to be obtained herein could not be increased to a satisfactory level; but if larger than 20 atomic %, the transparency of the film will be low.

The metal oxide composition comprising the basic constituent components as above and containing from 0.5 to 20 atomic %, relative to the total of all metal atoms therein, of iridium oxide, rhenium oxide and palladium oxide may be sintered to give sputtering targets, and the targets give transparent electroconductive films through sputtering. The films could have a light transmittance of at least 70%, and a work function of at least 5.4 electron volts. The work function of the films is nearly on the same level as the average ionization potential, 5.5 to 5.6 electron volts, of organic compounds for light-emitting substances or hole-transporting substances for organic electroluminescent devices. Accordingly, when the transparent electroconductive film is used as the anode in an organic electroluminescent device, the energy gap in hole injection from the anode to the hole transportation layer or to the light-emitting layer in the device could be reduced, and therefore the device could ensure increased hole injection efficiency. As a result, the driving voltage for the organic electroluminescent device could be lowered, heat generation that may be caused by the energy gap between the constituent layers could be retarded in the device, and the device could ensure long-term stable light emission.

For producing the transparent electroconductive material of the invention, for example, employed is a method comprising blending powders of the starting metal oxides in a predetermined ratio, followed by uniformly mixing and grinding the resulting blend in a mixing and grinding machine, for example, in a wet ball or bead mill or ultrasonically. In this, the raw material powders are preferably mixed and ground as fine as possible, but, in general, they are mixed and ground to have a mean grain size of not larger than 1 μm.

To obtain sintered products from the transparent electroconductive material, for example, the material is granulated, then the resulting granules are shaped into bodies of desired form by pressing, and the shaped bodies are finally baked. In the baking step, the shaped bodies are baked generally at a temperature falling between 1,200 and 1,500° C., but preferably between 1,250 and 1,480° C., for a period of time generally falling between 10 and 72 hours, but preferably between 24 and 48 hours. In this, the heating rate may fall between 1 and 50° C./min.

[IV] Fourth Aspect of the Invention

The transparent electroconductive material of the invention is of a composition that comprises metal oxide(s) of tin oxide, indium oxide and zinc oxide in the following atomic ratios:

Sn/(Sn+In+Zn)=0.55 to 1.00,

In/(Sn+In+Zn)=0.00 to 0.45,

Zn/(Sn+In+Zn)=0.00 to 0.25, and contains from 0.5 to 10 atomic %, relative to the total of all metal atoms therein, of one or more metal oxides selected from vanadium oxide, molybdenum oxide and ruthenium oxide.

More preferably, the transparent electroconductive material is of a composition that comprises metal oxides of tin oxide, indium oxide and zinc oxide in the following atomic ratios:

Sn/(Sn+In+Zn)=0.60 to 0.95,

In/(Sn+In+Zn)=0.00 to 0.35,

Zn/(Sn+In+Zn)=0.05 to 0.20, and contains from 0.5 to 10 atomic %, relative to the total of all metal atoms therein, of one or more metal oxides selected from vanadium oxide, molybdenum oxide and ruthenium oxide.

Even more preferably, the transparent electroconductive material is of a composition that comprises metal oxides of tin oxide, indium oxide and zinc oxide in the following atomic ratios:

Sn/(Sn+In+Zn)=0.55 to 0.95,

In/(Sn+In+Zn)=0.00 to 0.40,

Zn/(Sn+In+Zn)=0.05 to 0.25, and contains from 0.5 to 10 atomic %, relative to the total of all metal atoms therein, of one or more metal oxides selected from vanadium oxide, molybdenum oxide and ruthenium oxide.

Still more preferably, the transparent electroconductive material is of a composition that comprises metal oxides of tin oxide, indium oxide and zinc oxide in the following atomic ratios:

Sn/(Sn+In+Zn)=0.55 to 0.95,

In/(Sn+In+Zn)=0.00 to 0.40,

Zn/(Sn+In+Zn)=0.05 to 0.20, and contains from 0.5 to 10 atomic %, relative to the total of all metal atoms therein, of one or more metal oxides selected from vanadium oxide, molybdenum oxide and ruthenium oxide.

Most preferably, the transparent electroconductive material is of a composition that comprises metal oxides of tin oxide, indium oxide and zinc oxide in the following atomic ratios:

Sn/(Sn+In+Zn)=0.60 to 0.95,

In/(Sn+In+Zn)=0.00 to 0.35,

Zn/(Sn+In+Zn)=0.05 to 0.20, and contains from 0.5 to 10 atomic %, relative to the total of all metal atoms therein, of one or more metal oxides selected from vanadium oxide, molybdenum oxide and ruthenium oxide.

For the transparent electroconductive material of the invention, the composition of the basic constituent components, tin oxide, indium oxide and zinc oxide, or a mixture of these metal oxides may be tin oxide, indium oxide or zinc oxide each alone, or a mixture of tin oxide and indium oxide, or a mixture of tin oxide and zinc oxide, or a mixture of tin oxide, indium oxide and zinc oxide, as in the above.

Regarding the blend ratio of the basic constituent components, it is desirable that the atomic ratio of tin oxide is at least 0.55 in order that the cost of the material could be reduced and that the material could be formed into transparent electroconductive films with good heat resistance. Indium oxide is not always needed herein. However, in order that the material could be formed into transparent electroconductive films with high electroconductivity, it is desirable the atomic ratio of indium oxide is at most 0.45. If the atomic ratio of indium oxide is larger than 0.45, the costs for producing transparent electroconductive films from the material will increase. Zinc oxide is not always needed herein. However, in order that the material could be formed into transparent electroconductive films with improved etchability, zinc oxide may be added to the composition for the material. The atomic ratio of zinc oxide to be added to the composition is preferably at least 0.05. In order to improve the wet heat resistance of the transparent electroconductive films formed from the material, the atomic ratio of zinc oxide to be in the material is preferably at most 0.25. If the etchability of the transparent electroconductive films formed from the material is poor, a small amount of water or hydrogen may be added to the system where the sintered product of the material is sputtered to form the films, whereby the etchability of the films formed could be improved.

In the material, the basic constituent components shall be combined with any one of vanadium oxide, molybdenum oxide and ruthenium oxide or with a mixture of the metal oxides that may be in any desired ratio. The proportion of the additional metal oxides to be in the material shall fall between 0.5 and 10 atomic % relative to the total of all metal atoms constituting the material that includes the additional metal oxides. It may be given by the following formulae, in terms of the atomic ratio of the metals:

$$V/(In+Zn+Sn+V)=0.005 \text{ to } 0.10,$$

$$Mo/(In+Zn+Sn+Mo)=0.005 \text{ to } 0.10,$$

$$Ru/(In+Zn+Sn+Ru)=0.005 \text{ to } 0.10,$$

preferably, $$V/(In+Zn+Sn+V)=0.01 \text{ to } 0.08,$$

$$Mo/(In+Zn+Sn+Mo)=0.01 \text{ to } 0.08,$$

$$Ru/(In+Zn+Sn+Ru)=0.01 \text{ to } 0.08,$$

more preferably, $$V/(In+Zn+Sn+V)=0.02 \text{ to } 0.05,$$

$$Mo/(In+Zn+Sn+Mo)=0.02 \text{ to } 0.05,$$

$$Ru/(In+Zn+Sn+Ru)=0.02 \text{ to } 0.05.$$

If the proportion of the additional component of any of vanadium oxide, molybdenum oxide or ruthenium oxide or their mixture is smaller than 0.5 atomic %, the work function of the transparent electroconductive film to be obtained herein could not be increased to a satisfactory level; but if larger than 10 atomic %, the transparency of the film will be low.

The metal oxide composition comprising the basic constituent components as above and containing from 0.5 to 10 atomic %, relative to the total of all metal atoms therein, of vanadium oxide, molybdenum oxide or ruthenium oxide may be sintered to give sputtering targets, and the targets give transparent electroconductive films through sputtering. The films could have a light transmittance of at least 70%, and a work function of at least 5.4 electron volts. The work function of the films is nearly on the same level as the average ionization potential, 5.5 to 5.6 electron volts, of organic compounds for light-emitting substances or hole-transporting substances for organic electroluminescent devices. Accordingly, when the transparent electroconductive film is used as the anode in an organic electroluminescent device, the energy gap in hole injection from the anode to the hole transportation layer or to the light-emitting layer in the device could be reduced, and therefore the device could ensure increased hole injection efficiency. As a result, the driving voltage for the organic electroluminescent device could be lowered, heat generation that may be caused by the energy gap between the constituent layers could be retarded in the device, and the device could ensure long-term stable light emission.

For producing the transparent electroconductive material of the invention, for example, employed is a method comprising blending powders of the starting metal oxides in a predetermined ratio, followed by uniformly mixing and grinding the resulting blend in a mixing and grinding machine, for example, in a wet ball or bead mill or ultrasonically. In this, the raw material powders are preferably mixed and ground as fine as possible, but, in general, they are mixed and ground to have a mean grain size of not larger than 1 $\mu$m.

To obtain sintered products from the transparent electroconductive material, for example, the material is granulated, then the resulting granules are shaped into bodies of desired form by pressing, and the shaped bodies are finally baked. In the baking step, the shaped bodies are baked generally at a temperature falling between 1,200 and 1,500° C., but preferably between 1,250 and 1,480° C., for a period of time generally falling between 10 and 72 hours, but preferably between 24 and 48 hours. In this, the heating rate may fall between 1 and 50° C./min. The sintered products formed under the condition could have a specific resistance of at most 10 m$\Omega$.cm.

The sintered products thus obtained are machined into bodies fittable to sputtering units, and a fitting tool is attached to each body. In that manner, obtained are sputtering targets with good electroconductivity that could be sputtered stably.

[V] Transparent Electroconductive Glass and Films of the First to Fourth Aspects of the Invention The targets produced in the manner mentioned above may be sputtered to form films on transparent substrates. The transparent substrates may be any conventional one, including glass substrates, and synthetic resin films and sheets with high transparency. Preferred synthetic resins for the films and sheets are polycarbonate resins, polymethyl methacrylate resins, polyester resins, polyether-sulfone resins, polyarylate resins, etc.

For sputtering the targets to form transparent electroconductive films on transparent substrates, preferably used are magnetron sputtering units. The sputtering condition in the unit where the films are formed is described. The plasma output may vary, depending on the surface area of the target used and on the thickness of the transparent electroconductive film to be formed, but, in general, it may fall between 0.3 and 4 W per cm$^2$ of the surface area of the target, and the period of time for which the target is sputtered to form the film may fall between 5 and 120 minutes. Under the condition, the transparent electroconductive films formed could have a desired thickness. The thickness of the transparent electroconductive films shall vary, depending on the type the display devices in which they are sued, but, in general, it may fall between 200 and 6000 angstroms, preferably between 300 and 2000 angstroms.

The targets of the sintered products may also be used for forming films in electron-beaming units or ion-plating units. In these units, the targets could be formed into transparent electroconductive films under the same condition as above.

In the transparent electroconductive glass and films of the invention thus produced in the manner as above, the transparent electroconductive layer formed on a transparent substrate has high light transmittance and low specific resistance. The transparent electroconductive layer is well etched to give a transparent electrode. Specifically, after it is etched with hydrochloric acid or oxalic acid, its cross section in the boundary between the etched part and the non-etched part has a smooth profile, and the etched part is clearly differentiated from the non-etched part. The etched layer forms an electrode line circuit having a uniform width and a uniform thickness. Accordingly, the transparent electroconductive layer in the transparent electroconductive glass and films of the invention can be well etched in any ordinary manner to give good transparent electrodes. When a transparent electroconductive film with poor processability into electrodes is etched to form an electrode, the electric resistance of the circuit that comprises the resulting electrode will partly increase or decrease, and, as the case may be, the insulating area in the circuit will fail to prevent electric conduction and the circuit will break down. Contrary to this, the circuit that comprises the transparent electrode fabricated in the invention is free from the troubles.

In the first aspect of the invention, the transparent electroconductive layer formed from the sintered product that comprises the three-component metal oxides and containing an oxide of a positive tetra-valent or higher poly-valent metal has a high light transmittance of at least 75% and are therefore highly transparent. In addition, It has a specific resistance of at most 5 mΩ.cm and a work function of at least 5.45. With the layer, the transparent electroconductive glass and films of the invention are favorable to transparent electrodes for organic electroluminescent devices. In this embodiment, if the proportion of the additional metal oxide with a positive tetra-valent or higher poly-valent metal is too large, the electroconductivity of the layer will be low. Therefore, when the layer is desired to have high electroconductivity, it shall have a laminate structure comprising a lower layer of the three-component metal oxides and an upper layer of the additional metal oxide with a positive tetra-valent or higher poly-valent metal. Thus layered, the two shall be sintered. The two-layered, transparent electroconductive layer could have higher electroconductivity, and its work function could be nearly on the same level as that of organic compounds for organic electroluminescent devices. The layer is favorably used as an electrode in organic electroluminescent devices.

In the transparent electroconductive glass and films of the second aspect of the invention thus produced in the manner as above, the metal oxide composition of the transparent electroconductive layer is the same as that of the sintered product used for forming the layer. Regarding its transparency, the transparent electroconductive layer has a light transmittance of larger than 75% for light having a wavelength of 500 nm. Regarding its electroconductivity, the layer has a specific resistance of at most 5 mΩ.cm. As mentioned hereinabove, the work function of the layer is at least 5.45 electron volts and is higher than that of ordinary ITO films.

In the transparent electroconductive glass and films of the third aspect of the invention thus produced in the manner as above, the metal oxide composition of the transparent electroconductive layer is the same as that of the sintered product used for forming the layer. Regarding its transparency, the transparent electroconductive layer has a light transmittance of larger than 70% for light having a wavelength of 500 nm. Regarding its electroconductivity, the layer generally has a specific resistance of at most 5 mΩ.cm. As mentioned hereinabove, the work function of the layer is higher than that of ordinary ITO films, and is at least 5.4 electron volts nearly on the same level as the ionization potential of organic compounds for light-emitting layers or hole transportation layers in organic electroluminescent devices.

In the transparent electroconductive glass and films of the fourth aspect of the invention thus produced in the manner as above, the metal oxide composition of the transparent electroconductive layer is the same as that of the sintered product used for forming the layer. Regarding its transparency, the transparent electroconductive layer has a light transmittance of larger than 70% for light having a wavelength of 500 nm. As mentioned hereinabove, the work function of the layer is higher than that of ordinary ITO films, and is at least 5.4 electron volts nearly on the same level as the ionization potential of organic compounds for light-emitting layers or hole transportation layers in organic electroluminescent devices.

Accordingly, the transparent electroconductive glass and films of the invention are favorably used as transparent electrodes in various display devices such as typically organic electroluminescent devices.

The invention is described in more detail with reference to the following Examples, which, however, are not intended to restrict the scope of the invention.

First Aspect of the Invention

EXAMPLE I-1

(1) Production of Sintered Discs

Raw material powders of indium oxide, tin oxide and zinc oxide were fed into a wet ball mill in the following atomic ratios:

$$In/(In+Sn+Zn)=0.50$$

$$Sn/(In+Sn+Zn)=0.25,$$

$$Zn/(In+Sn+Zn)=0.25,$$

and mixed and ground therein for 72 hours. The resulting mixture was granulated, and then pressed into discs having a diameter of 4 inches and a thickness of 5 mm. The discs were put into a baking furnace and baked therein under pressure at 1400° C. for 36 hours.

The sintered discs had a density of 6.6 g/cm$^3$ and a bulk resistance of 0.95 mΩ.cm.

Through X-ray diffractiometric analysis for the crystallinity of the sintered discs, it was verified that crystals of indium oxide, crystals of a hexagonal phyllo-compound of indium oxide and zinc oxide represented by $In_2O_3.(ZnO)m$ with m being 4, 5 and 7, and crystals of a spinel-structured compound of essentially $Zn_2SnO_4$ were formed in the sintered discs.

The data are given in Table I-1.

(2) Production of Transparent Electroconductive Glass

The sintered product having been prepared in (1) was formed into sputtering targets having a diameter of 4 inches and a thickness of 5 mm. The target was set in a DC magnetron sputtering unit, and sputtered onto a glass substrate set therein.

Regarding the sputtering condition, the atmosphere in the unit was argon gas combined with a suitable amount of oxygen gas; the sputtering pressure was $3\times10^{-1}$ Pa; the ultimate vacuum degree was 5×10⁻⁴ Pa; the substrate temperature was 25° C.; the power applied was 100 W; the time for film deposition was 14 minutes.

The transparent electroconductive film formed on the glass substrate had a thickness of 1,200 angstroms, and was amorphous. Its light transmittance for light having a wavelength of 500 nm was measured with a spectrophotometer, and was 79%. The specific resistance of the film, measured according to a 4-probe method, was 0.36 mΩ.cm, and the electroconductivity of the film was high. The work function of the film was measured through UV photoelectron spectrometry.

(3) Evaluation of Processability of Transparent Electroconductive Film

The transparent electroconductive film formed on the glass substrate in (2) was coated with a resist, exposed via a mask with linear holes therethrough, and developed. With the patterned resist thereon, the film was etched with an aqueous solution of hydrochloric acid. In the film thus etched, the boundary between the etched area and the non-etched area had a smooth inclined surface. The part of the film that had been contacted with the etching solution was removed, and no film residue remained in the area where the film had been contacted with the etching solution.

The evaluation data are given in Table I-2.

EXAMPLE I-2

Transparent electroconductive glass was produced in the same manner as in Example I-1, except that the glass substrate was kept at 215° C. during the sputtering process (2).

The transparent electroconductive film formed on the glass substrate was evaluated, and the data are given in Table I-2.

EXAMPLE I-3

A transparent electroconductive film was produced in the same manner as in Example I-1, except that a polycarbonate substrate having a thickness of 0.1 mm was used as the transparent glass substrate in the step (1).

The transparent electroconductive film formed on the polycarbonate substrate was evaluated, and the data are given in Table I-2.

EXAMPLE I-4
(1) Production of Sintered Discs

Sintered discs were produced in the same manner as in Example I-1. In this, however, raw material powders of indium oxide, tin oxide and zinc oxide were mixed in the following atomic ratios:

$In/(In+Sn+Zn)=0.50$ $Sn/(In+Sn+Zn)=0.45$, $Zn/(In+Sn+Zn)=0.05$.

The sintered discs had a density of 6.8 g/cm³ and a bulk resistance of 0.98 mΩ.cm. Regarding the crystallinity of the sintered discs, it was verified that crystals of indium oxide, crystals of a hexagonal phyllo-compound of indium oxide and zinc oxide represented by $In_2O_3.(ZnO)m$ with m being 4, 5 and 7, and crystals of a spinel-structured compound of essentially $Zn_2SnO_4$ were formed in the sintered discs.

The data are given in Table I-1.

(2) Production of Transparent Electroconductive Glass

Transparent electroconductive glass was produced in the same manner as in the step (2) in Example I-1. In this, however, the sintered discs prepared in the previous step (1) were used.

(3) Evaluation of Processability of Transparent Electroconductive Film

The processability of the transparent electroconductive film formed on the glass substrate in the previous step (2) was evaluated in the same manner as in the step (3) in Example I-1.

The evaluation data are given in Table I-2.

EXAMPLE I-5
(1) Production of Sintered Discs

Sintered discs were produced in the same manner as in Example I-1. In this, however, raw material powders of indium oxide, tin oxide and zinc oxide were mixed in the following atomic ratios:

$In/(In+Sn+Zn)=0.70$ $Sn/(In+Sn+Zn)=0.25$, $Zn/(In+Sn+Zn)=0.05$.

The sintered discs had a density of 6.8 g/cm³ and a bulk resistance of 0.87 mΩ.cm. Regarding the crystallinity of the sintered discs, it was verified that crystals of indium oxide, crystals of a hexagonal phyllo-compound of indium oxide and zinc oxide represented by $In_2O_3.(ZnO)m$ with m being 4, 5 and 7, and crystals of a spinel-structured compound of essentially $Zn_2SnO_4$ were formed in the sintered discs.

The data are given in Table I-1.

(2) Production of Transparent Electroconductive Glass

Transparent electroconductive glass was produced in the same manner as in the step (2) in Example I-1. In this, however, the sintered discs prepared in the previous step (1) were used.

(3) Evaluation of Processability of Transparent Electroconductive Film

The processability of the transparent electroconductive film formed on the glass substrate in the previous step (2) was evaluated in the same manner as in the step (3) in Example I-1.

The evaluation data are given in Table I-2.

EXAMPLE I-6
(1) Production of Sintered Discs

Sintered discs were produced in the same manner as in Example I-1. In this, however, raw material powders of indium oxide, tin oxide and zinc oxide were mixed in the following atomic ratios:

$In/(In+Sn+Zn)=0.60$ $Sn/(In+Sn+Zn)=0.30$, $Zn/(In+Sn+Zn)=0.10$.

The sintered discs had a density of 6.7 g/cm³ and a bulk resistance of 0.82 mΩ.cm. Regarding the crystallinity of the sintered discs, it was verified that crystals of indium oxide, crystals of a hexagonal phyllo-compound of indium oxide and zinc oxide represented by $In_2O_3.(ZnO)m$ with m being 4, 5 and 7, and crystals of a spinel-structured compound of essentially $Zn_2SnO_4$ were formed in the sintered discs.

The data are given in Table I-1.

(2) Production of Transparent Electroconductive Glass

Transparent electroconductive glass was produced in the same manner as in the step (2) in Example I-1. In this, however, the sintered discs prepared in the previous step (1) were used.

(3) Evaluation of Processability of Transparent Electroconductive Film

The processability of the transparent electroconductive film formed on the glass substrate in the previous step (2) was evaluated in the same manner as in the step (3) in Example I-1.

The evaluation data are given in Table I-2.

EXAMPLE I-7

(1) Production of Sintered Discs

Sintered discs were produced in the same manner as in Example I-1. In this, however, raw material powders of indium oxide, tin oxide and zinc oxide were mixed in the following atomic ratios:

In/(In+Sn+Zn)=0.60

Sn/(In+Sn+Zn)=0.30,

Zn/(In+Sn+Zn)=0.10, and the resulting mixture was further mixed with powder of ruthenium oxide in the following ratio:

Ru/(In+Sn+Zn+Ru)=0.02.

The sintered discs had a density of 6.7 g/cm$^3$ and a bulk resistance of 0.80 mΩ.cm. Regarding the crystallinity of the sintered discs, it was verified that crystals of indium oxide, crystals of a hexagonal phyllo-compound of indium oxide and zinc oxide represented by $In_2O_3.(ZnO)m$ with m being 4, 5 and 7, and crystals of a spinel-structured compound of essentially $Zn_2SnO_4$ were formed in the sintered discs.

The data are given in Table I-1. In Table I-1, Me in the column of the metal oxide composition indicates Ru (the same shall apply to Mo and others to be mentioned hereinunder).

(2) Production of Transparent Electroconductive Glass:

Transparent electroconductive glass was produced in the same manner as in the step (2) in Example I-1. In this, however, the sintered discs prepared in the previous step (1) were used.

(3) Evaluation of Processability of Transparent Electroconductive Film

The processability of the transparent electroconductive film formed on the glass substrate in the previous step (2) was evaluated in the same manner as in the step (3) in Example I-1.

The evaluation data are given in Table I-2.

EXAMPLE I-8

(1) Production of Sintered Discs

Sintered discs were produced in the same manner as in Example I-1. In this, however, raw material powders of indium oxide, tin oxide and zinc oxide were mixed in the following atomic ratios:

In/(In+Sn+Zn)=0.60

Sn/(In+Sn+Zn)=0.30,

Zn/(In+Sn+Zn)=0.10, and the resulting mixture was further mixed with powder of molybdenum oxide in the following ratio:

Mo/(In+Sn+Zn+Mo)=0.02.

The sintered discs had a density of 6.8 g/cm$^3$ and a bulk resistance of 0.94 mΩ.cm. Regarding the crystallinity of the sintered discs, it was verified that crystals of indium oxide, crystals of a hexagonal phyllo-compound of indium oxide and zinc oxide represented by $In_2O_3.(ZnO)m$ with m being 4, 5 and 7, and crystals of a spinel-structured compound of essentially $Zn_2SnO_4$ were formed in the sintered discs.

The data are given in Table I-1.

(2) Production of Transparent Electroconductive Glass

Transparent electroconductive glass was produced in the same manner as in the step (2) in Example I-1. In this, however, the sintered discs prepared in the previous step (1) were used.

(3) Evaluation of Processability of Transparent Electroconductive Film

The processability of the transparent electroconductive film formed on the glass substrate in the previous step (2) was evaluated in the same manner as in the step (3) in Example I-1.

The evaluation data are given in Table I-2.

EXAMPLE I-9

(1) Production of Sintered Discs

Sintered discs were produced in the same manner as in Example I-1. In this, however, raw material powders of indium oxide, tin oxide and zinc oxide were mixed in the following atomic ratios:

In/(In+Sn+Zn)=0.60

Sn/(In+Sn+Zn)=0.30,

Zn/(In+Sn+Zn)=0.10, and the resulting mixture was further mixed with powder of vanadium oxide in the following ratio:

V/(In+Sn+Zn+V)=0.02.

The sintered discs had a density of 6.8 g/cm$^3$ and a bulk resistance of 0.99 mΩ.cm. Regarding the crystallinity of the sintered discs, it was verified that crystals of indium oxide, crystals of a hexagonal phyllo-compound of indium oxide and zinc oxide represented by $In_2O_3.(ZnO)m$ with m being 4, 5 and 7, and crystals of a spinel-structured compound of essentially $Zn_2SnO_4$ were formed in the sintered discs.

The data are given in Table I-1.

(2) Production of Transparent Electroconductive Glass

Transparent electroconductive glass was produced in the same manner as in the step (2) in Example I-1. In this, however, the sintered discs prepared in the previous step (1) were used.

(3) Evaluation of Processability of Transparent Electroconductive Film

The processability of the transparent electroconductive film formed on the glass substrate in the previous step (2) was evaluated in the same manner as in the step (3) in Example I-1.

The evaluation data are given in Table I-2.

Comparative Example I-1

(1) Production of Sintered Discs

Sintered discs were produced in the same manner as in Example I-1. In this, however, raw material powders of indium oxide and zinc oxide were mixed in the following atomic ratios:

In/(In+Zn)=0.85

Zn/(In+Zn)=0.15.

The sintered discs had a density of 6.75 g/cm$^3$ and a bulk resistance of 2.74 mΩ.cm. Regarding the crystallinity of the sintered discs, it was verified that crystals of indium oxide, and crystals of a hexagonal phyllo-compound of indium oxide-zinc oxide were formed in the sintered discs.

The data are given in Table I-1.

(2) Production of Transparent Electroconductive Glass

Transparent electroconductive glass was produced in the same manner as in the step (2) in Example I-1. In this, however, the sintered discs prepared in the previous step (1) were used.

Since the specific resistance of the sintered discs used herein was high, the sputtering stability thereof was poor. Therefore, it took 17 minutes to form the film having the predetermined thickness.

(3) Evaluation of Processability of Transparent Electroconductive Film

The processability of the transparent electroconductive film formed on the glass substrate in the previous step (2) was evaluated in the same manner as in the step (3) in Example I-1.

The evaluation data are given in Table I-2.

Comparative Example I-2

(1) Production of Sintered Discs

Sintered discs were produced in the same manner as in Example I-1. In this, however, raw material powders of indium oxide and tin oxide were mixed in the following atomic ratios:

In/(In+Sn)=0.90

Sn/(In+Sn)=0.10.

The sintered discs had a density of 6.71 g/cm$^3$ and a bulk resistance of 0.69 mΩ.cm. Regarding the crystallinity of the sintered discs, it was verified that crystals of indium oxide were formed in the sintered discs.

The data are given in Table I-1.

(2) Production of Transparent Electroconductive Glass

Transparent electroconductive glass was produced in the same manner as in the step (2) in Example I-1. In this, however, the sintered discs prepared in the previous step (1) were used.

(3) Evaluation of Processability of Transparent Electroconductive Film

The processability of the transparent electroconductive film formed on the glass substrate in the previous step (2) was evaluated in the same manner as in the step (3) in Example I-1.

The evaluation data are given in Table I-2.

Comparative Example I-3

Transparent electroconductive glass was produced in the same manner as in Comparative Example I-2. In this, however, the temperature of the glass substrate in the sputtering step was 215° C.

The transparent electroconductive film formed on the glass substrate was evaluated, and the evaluation data are given in Table I-2.

TABLE I-1 (1)

| Example | I-1 | I-4 | I-5 | I-6 |
|---|---|---|---|---|
| In/(In + Sn + Zn) | 0.50 | 0.50 | 0.70 | 0.60 |
| Sn/(In + Sn + Zn) | 0.25 | 0.45 | 0.25 | 0.30 |
| Zn/(In + Sn + Zn) | 0.25 | 0.05 | 0.05 | 0.10 |
| Density of sintered discs (g/cm$^3$) | 6.6 | 6.8 | 6.8 | 6.7 |
| Bulk resistance (mΩ · cm) | 0.95 | 0.98 | 0.87 | 0.82 |
| Crystallinity | | | | |
| Indium oxide | yes | yes | yes | yes |
| Hexagonal phyllo-compound | yes | yes | yes | yes |
| Spinel compound | yes | yes | yes | yes |

TABLE I-1 (2)

| | Example | | | Comparative Example | |
|---|---|---|---|---|---|
| | I-7 | I-8 | I-9 | I-1 | I-2 |
| In/(In + Sn + Zn) | 0.60 | 0.60 | 0.60 | 0.85 | 0.90 |
| Sn/(In + Sn + Zn) | 0.30 | 0.30 | 0.30 | — | 0.10 |
| Zn/(In + Sn + Zn) | 0.10 | 0.10 | 0.10 | 0.15 | — |
| Me/(In + Sn + Zn + Me) | 0.02 | 0.02 | 0.02 | — | — |
| Density of sintered discs (g/cm$^3$) | 6.7 | 6.8 | 6.8 | 6.75 | 6.71 |
| Bulk resistance (mΩ · cm) | 0.80 | 0.94 | 0.99 | 2.74 | 0.69 |
| Crystallinity | | | | | |
| Indium oxide | yes | yes | yes | yes | yes |
| Hexagonal phyllo-compound | yes | yes | yes | no | no |
| Spinel compound | yes | yes | yes | no | no |

TABLE I-2 (1)

| Example | Specific Resistance of Film (mΩ · cm) | Light Transmittance (%) | Crystallinity | Work Function (eV) | Processability into Electrodes (cross section of etched film) |
|---|---|---|---|---|---|
| I-1 | 0.36 | 79 | amorphous | 5.11 | flat |
| I-2 | 0.34 | 79 | amorphous | 5.12 | flat |
| I-3 | 0.37 | 78 | amorphous | 5.12 | flat |
| I-4 | 0.24 | 80 | amorphous | 5.16 | flat |
| I-5 | 0.27 | 81 | amorphous | 5.18 | flat |
| I-6 | 0.29 | 80 | amorphous | 5.15 | flat |
| I-7 | 1.3 | 79 | amorphous | 5.49 | flat |

TABLE I-2 (1)-continued

| Example | Specific Resistance of Film (mΩ · cm) | Light Transmittance (%) | Crystallinity | Work Function (eV) | Processability into Electrodes (cross section of etched film) |
|---|---|---|---|---|---|
| I-8 | 3.5 | 78 | amorphous | 5.55 | flat |
| I-9 | 2.4 | 78 | amorphous | 5.57 | flat |

TABLE I-2 (2)

| Comparative Example | Specific Resistance of Film (mΩ · cm) | Light Transmittance (%) | Crystallinity | Work Function (eV) | Processability into Electrodes (cross section of etched film) |
|---|---|---|---|---|---|
| I-1 | 0.34 | 80 | amorphous | 5.18 | flat |
| I-2 | 0.42 | 80 | microcrystalline | 4.97 | rough |
| I-3 | 0.18 | 82 | crystalline | 4.95 | rough |

Second Aspect of the Invention

EXAMPLE II-1

(1) Production of Sintered Discs

Raw material powders of indium oxide and ruthenium oxide were mixed in the following atomic ratio:

Ru/(In+Ru)=0.03, and the mixture was fed into a wet ball, and further mixed and ground therein for 72 hours. The resulting mixture was granulated, and then pressed into discs having a diameter of 4 inches and a thickness of 5 mm. The discs were put into a baking furnace and baked therein under pressure at 1400° C. for 36 hours.

The sintered discs had a density of 6.8 g/cm$^3$ and a bulk resistance of 0.80 mΩ.cm.

The data are given in Table II-1.

(2) Production of Transparent Electroconductive Glass

The sintered product having been prepared in (1) was formed into sputtering targets having a diameter of 4 inches and a thickness of 5 mm. The target was set in a DC magnetron sputtering unit, and sputtered onto a glass substrate set therein.

Regarding the sputtering condition, the atmosphere in the unit was argon gas combined with a suitable amount of oxygen gas; the sputtering pressure was 3×10$^{-1}$ Pa; the ultimate vacuum degree was 5×10$^{-4}$ Pa; the substrate temperature was 25° C.; the power applied was 100 W; the time for film deposition was 14 minutes.

The transparent electroconductive film formed on the glass substrate had a thickness of 1,200 angstroms, and was amorphous. Its light transmittance for light having a wavelength of 500 nm was measured with a spectrophotometer, and was 79%. The specific resistance of the film, measured according to a 4-probe method, was 0.84 mΩ.cm, and the electroconductivity of the film was high. The work function of the film was measured through UV photoelectron spectrometry, and was 5.51 electron volts.

The evaluation data of the transparent electroconductive film are given in Table II-2.

EXAMPLE II-2

(1) Production of Sintered Discs

Sintered discs were produced in the same manner as in the step (1) in Example II-1. In this, however, molybdenum oxide was used in place of ruthenium oxide, and its atomic ratio was:

Mo/(In+Mo)=0.07.

The physical properties of the sintered discs produced herein are given in Table II-1.

(2) Production of Transparent Electroconductive Glass

Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-3

(1) Production of Sintered Discs

Sintered discs were produced in the same manner as in the step (1) in Example II-1. In this, however, vanadium oxide was used in place of ruthenium oxide, and its atomic ratio was:

V/(In+V)=0.05.

The physical properties of the sintered discs produced herein are given in Table II-1.

(2) Production of Transparent Electroconductive Glass

Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-4

(1) Production of Sintered Discs

Sintered discs were produced in the same manner as in the step (1) in Example II-1. In this, however, raw material powders of indium oxide and zinc oxide were mixed in the following atomic ratios:

In/(In+Zn)=0.83

Zn/(In+Zn)=0.17, and the resulting mixture was further mixed with ruthenium oxide in the following atomic ratio:

Ru/(In+Zn+Ru)=0.020.

The physical properties of the sintered discs produced herein are given in Table II-1.
(2) Production of Transparent Electroconductive Glass Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-5
(1) Production of Sintered Discs

Sintered discs were produced in the same manner as in the step (1) in Example II-1. In this, however, raw material powders of indium oxide and zinc oxide were mixed in the following atomic ratios:

In/(In+Zn)=0.85

Zn/(In+Zn)=0.15, and the resulting mixture was further mixed with molybdenum oxide in the following atomic ratio:

Mo/(In+Zn+Mo)=0.020.

The physical properties of the sintered discs produced herein are given in Table II-1.
(2) Production of Transparent Electroconductive Glass Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-6
(1) Production of Sintered Discs

Sintered discs were produced in the same manner as in the step (1) in Example II-1. In this, however, raw material powders of indium oxide and zinc oxide were mixed in the following atomic ratios:

In/(In+Zn)=0.85

Zn/(In+Zn)=0.15, and the resulting mixture was further mixed with vanadium oxide in the following atomic ratio:

V/(In+Zn+V)=0.020.

The physical properties of the sintered discs produced herein are given in Table II-1.
(2) Production of Transparent Electroconductive Glass Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-7
(1) Production of Sintered Discs

Sintered discs were produced in the same manner as in the step (1) in Example II-1. In this, however, raw material powders of indium oxide and zinc oxide were mixed in the following atomic ratios:

In/(In+Zn)=0.93

Zn/(In+Zn)=0.07, and the resulting mixture was further mixed with ruthenium oxide in the following atomic ratio:

Ru/(In+Zn+Ru)=0.015.

The physical properties of the sintered discs produced herein are given in Table II-1.
(2) Production of Transparent Electroconductive Glass Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-8
(1) Production of Sintered Discs

Sintered discs were produced in the same manner as in the step (1) in Example II-1. In this, however, raw material powders of indium oxide and zinc oxide were mixed in the following atomic ratios:

In/(In+Zn)=0.90

Zn/(In+Zn)=0.10, and the resulting mixture was further mixed with molybdenum oxide in the following atomic ratio:

Mo/(In+Zn+Mo)=0.050.

The physical properties of the sintered discs produced herein are given in Table II-1.
(2) Production of Transparent Electroconductive Glass Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-9
(1) Production of Sintered Discs

Sintered discs were produced in the same manner as in the step (1) in Example II-1. In this, however, raw material powders of indium oxide and zinc oxide were mixed in the following atomic ratios:

In/(In+Zn)=0.90

Zn/(In+Zn)=0.10, and the resulting mixture was further mixed with vanadium oxide in the following atomic ratio:

V/(In+Zn+V)=0.070.

The physical properties of the sintered discs produced herein are given in Table II-1.
(2) Production of Transparent Electroconductive Glass Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-10

(1) Production of Sintered Discs

Sintered discs were produced in the same manner as in the step (1) in Example II-1. In this, however, raw material powders of indium oxide and tin oxide were mixed in the following atomic ratios:

$In/(In+Sn)=0.80$ $Sn/(In+Sn)=0.20$, and the resulting mixture was further mixed with ruthenium oxide in the following atomic ratio:

$Ru/(In+Sn+Ru)=0.030$.

The physical properties of the sintered discs produced herein are given in Table II-1.

(2) Production of Transparent Electroconductive Glass

Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-11

(1) Production of Sintered Discs

Sintered discs were produced in the same manner as in the step (1) in Example II-1. In this, however, raw material powders of indium oxide and tin oxide were mixed in the following atomic ratios:

$In/(In+Sn)=0.80$ $Sn/(In+Sn)=0.20$, and the resulting mixture was further mixed with molybdenum oxide in the following atomic ratio:

$Mo/(In+Sn+Mo)=0.070$.

The physical properties of the sintered discs produced herein are given in Table II-1.

(2) Production of Transparent Electroconductive Glass

Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-12

(1) Production of Sintered Discs

Sintered discs were produced in the same manner as in the step (1) in Example II-1. In this, however, raw material powders of indium oxide and tin oxide were mixed in the following atomic ratios:

$In/(In+Sn)=0.80$ $Sn/(In+Sn)=0.20$, and the resulting mixture was further mixed with vanadium oxide in the following atomic ratio:

$V/(In+Sn+V)=0.050$.

The physical properties of the sintered discs produced herein are given in Table II-1.

(2) Production of Transparent Electroconductive Glass

Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-13

(1) Production of Sintered Discs

Sintered discs were produced in the same manner as in the step (1) in Example II-1. In this, however, raw material powders of indium oxide and tin oxide were mixed in the following atomic ratios:

$In/(In+Sn)=0.90$ $Sn/(In+Sn)=0.10$, and the resulting mixture was further mixed with ruthenium oxide in the following atomic ratio:

$Ru/(In+Sn+Ru)=0.021$.

The physical properties of the sintered discs produced herein are given in Table II-1.

(2) Production of Transparent Electroconductive Glass

Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-14

(1) Production of Sintered Discs

Sintered discs were produced in the same manner as in the step (1) in Example II-1. In this, however, raw material powders of indium oxide and tin oxide were mixed in the following atomic ratios:

$In/(In+Sn)=0.90$ $Sn/(In+Sn)=0.10$, and the resulting mixture was further mixed with molybdenum oxide in the following atomic ratio:

$Mo/(In+Sn+Mo)=0.020$.

The physical properties of the sintered discs produced herein are given in Table II-1.

(2) Production of Transparent Electroconductive Glass

Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-15

(1) Production of Sintered Discs

Sintered discs were produced in the same manner as in the step (1) in Example II-1. In this, however, raw material powders of indium oxide and tin oxide were mixed in the following atomic ratios:

In/(In+Sn)=0.90

Sn/(In+Sn)=0.10, and the resulting mixture was further mixed with vanadium oxide in the following atomic ratio:

V/(In+Sn+V)=0.020.

The physical properties of the sintered discs produced herein are given in Table II-1.
(2) Production of Transparent Electroconductive Glass
Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-16
(1) Production of Sintered Discs
Sintered discs were produced in the same manner as in the step (1) in Example II-1. In this, however, raw material powders of indium oxide, zinc oxide and tin oxide were mixed in the following atomic ratios:

In/(In+Zn+Sn)=0.80

Zn/(In+Zn+Sn)=0.10

Sn/(In+Zn+Sn)=0.10, and the resulting mixture was further mixed with ruthenium oxide in the following atomic ratio:

Ru/(In+Zn+Sn+Ru)=0.022.

The physical properties of the sintered discs produced herein are given in Table II-1.
(2) Production of Transparent Electroconductive Glass
Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-17
(1) Production of Sintered Discs
Sintered discs were produced in the same manner as in the step (1) in Example II-1. In this, however, raw material powders of indium oxide, zinc oxide and tin oxide were mixed in the following atomic ratios:

In/(In+Zn+Sn)=0.80

Zn/(In+Zn+Sn)=0.10

Sn/(In+Zn+Sn)=0.10, and the resulting mixture was further mixed with molybdenum oxide in the following atomic ratio:

Mo/(In+Zn+Sn+Mo)=0.050.

The physical properties of the sintered discs produced herein are given in Table II-1.
(2) Production of Transparent Electroconductive Glass
Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-18
(1) Production of Sintered Discs
Sintered discs were produced in the same manner as in the step (1) in Example II-1. In this, however, raw material powders of indium oxide, zinc oxide and tin oxide were mixed in the following atomic ratios:

In/(In+Zn+Sn)=0.80

Zn/(In+Zn+Sn)=0.10

Sn/(In+Zn+Sn)=0.10, and the resulting mixture was further mixed with vanadium oxide in the following atomic ratio:

V/(In+Zn+Sn+V)=0.050.

The physical properties of the sintered discs produced herein are given in Table II-1.
(2) Production of Transparent Electroconductive Glass
Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-19
(1) Production of Sintered Discs
Sintered discs were produced in the same manner as in the step (1) in Example II-1. In this, however, raw material powders of indium oxide, zinc oxide and tin oxide were mixed in the following atomic ratios:

In/(In+Zn+Sn)=0.90

Zn/(In+Zn+Sn)=0.07

Sn/(In+Zn+Sn)=0.03, and the resulting mixture was further mixed with ruthenium oxide in the following atomic ratio:

Ru/(In+Zn+Sn+Ru)=0.025.

The physical properties of the sintered discs produced herein are given in Table II-1.
(2) Production of Transparent Electroconductive Glass
Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-20
(1) Production of Sintered Discs
Sintered discs were produced in the same manner as in the step (1) in Example II-1. In this, however, raw material powders of indium oxide, zinc oxide and tin oxide were mixed in the following atomic ratios:

In/(In+Zn+Sn)=0.90

Zn/(In+Zn+Sn)=0.07

Sn/(In+Zn+Sn)=0.03, and the resulting mixture was further mixed with molybdenum oxide in the-following atomic ratio:

Mo/(In+Zn+Sn+Mo)=0.035.

The physical properties of the sintered discs produced herein are given in Table II-1.
(2) Production of Transparent Electroconductive Glass Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-21

(1) Production of Sintered Discs

Sintered discs were produced in the same manner as in the step (1) in Example II-1. In this, however, raw material powders of indium oxide, zinc oxide and tin oxide were mixed in the following atomic ratios:

In/(In+Zn+Sn)=0.90

Zn/(In+Zn+Sn)=0.07

Sn/(In+Zn+Sn)=0.03, and the resulting mixture was further mixed with vanadium oxide in the following atomic ratio:

V/(In+Zn+Sn+V)=0.035.

The physical properties of the sintered discs produced herein are given in Table II-1.
(2) Production of Transparent Electroconductive Glass Transparent electroconductive glass was produced in the same manner as in the step (2) in Example II-1. In this, however, the sintered discs prepared in the previous step (1) were used. The transparent electroconductive film formed on the glass substrate was evaluated, and the data of its physical properties are given in Table II-2.

EXAMPLE II-22

Using a sintered disc that had been prepared in the same manner as in the step (1) in Example II-4, as the target, transparent electroconductive glass was produced in the same manner as in Example II-4. In this, however, the glass substrate was kept heated at 215° C. in the sputtering step (2).

The transparent electroconductive film formed on the glass substrate was evaluated in the same manner as in the step (2) in Example II-1, and the data are given in Table II-2.

EXAMPLE II-23

Using a sintered disc that had been prepared in the same manner as in the step (1) in Example II-10, as the target, transparent electroconductive glass was produced in the same manner as in Example II-10. In this, however, the glass substrate was kept heated at 215° C. in the sputtering step (2).

The transparent electroconductive film formed on the glass substrate was evaluated in the same manner as in the step (2) in Example II-1, and the data are given in Table II-2.

EXAMPLE II-24

Using a sintered disc that had been prepared in the same manner as in the step (1) in Example II-10, as the target, transparent electroconductive glass was produced in the same manner as in Example II-10. In this, however, 2% by weight of water was added to the sputtering system in the step (2).

The transparent electroconductive film formed on the glass substrate was evaluated in the same manner as in the step (2) in Example II-1, and the data are given in Table II-2.

The transparent electroconductive film thus produced herein was annealed at 215° C. for 1 hour, and its physical properties were measured. Before and after the annealing, there was found no chance in the physical properties of the film.

EXAMPLE II-25

Using a sintered disc that had been prepared in the same manner as in the step (1) in Example II-4, as the target, a transparent electroconductive film was produced in the same manner as in Example II-4. In this, however, a transparent polycarbonate substrate having a thickness of 0.1 mm was used in place of the glass substrate used in the step (2) in Example II-4.

The transparent electroconductive film formed on the polycarbonate substrate was evaluated in the same manner as in the step (2) in Example II-1, and the data are given in Table II-2.

COMPARATIVE EXAMPLE II-1

A transparent electroconductive film was formed on a glass substrate in the same manner as in the step (2) in Example II-1. In this, however, the target used was produced from a sintered product that had been prepared in the same manner as in the step (1) in Example II-1 except that a mixture of powders of indium oxide and tin oxide in the following atomic ratios:

In/(In+Zn)=0.85

Zn/(In+Zn)=0.15, was used alone without adding thereto any additional component of ruthenium oxide or the like.

The transparent electroconductive film formed on the glass substrate was evaluated, and the evaluation data are given in Table II-2.

COMPARATIVE EXAMPLE II-2

Sintered discs were produced in the same manner as in the step (1) in Example II-1, except that a mixture of powders of indium oxide and tin oxide in the following atomic ratios:

In/(In+Zn)=0.90

Zn/(In+Zn)=0.10, was used alone without adding thereto any additional component of ruthenium oxide or the like. These were formed into sputtering targets. Using the target produced herein, transparent electroconductive glass was produced in the same manner as in the step (2) in Example II-1. In this, however, the glass substrate was kept heated at 215° C. in the sputtering step.

The transparent electroconductive film formed on the glass substrate was evaluated, and the evaluation data are given in Table II-2.

TABLE II-1 (1)

|  | II-1 | II-2 | II-3 | II-4 | II-5 | II-6 | II-7 |
|---|---|---|---|---|---|---|---|
| In/(In + Zn + Sn) | 1.00 | 1.00 | 1.00 | 0.83 | 0.85 | 0.85 | 0.93 |
| Zn/(In + Zn + Sn) | — | — | — | 0.17 | 0.15 | 0.15 | 0.07 |
| Sn/(In + Zn + Sn) | — | — | — | — | — | — | — |
| Ru/(In + Zn + Sn + Ru) | 0.030 | — | — | 0.020 | — | — | 0.015 |
| Mo/(In + Zn + Sn + Mo) | — | 0.070 | — | — | 0.020 | — | — |
| V/(In + Zn + Sn + V) | — | — | 0.050 | — | — | 0.020 | — |
| Density of Sintered Discs (g/cm$^3$) | 6.81 | 6.78 | 6.76 | 6.81 | 6.90 | 6.70 | 6.75 |
| Bulk Resistance (mΩ·cm) | 0.80 | 0.88 | 0.95 | 0.95 | 2.74 | 1.72 | 0.95 |

TABLE II-1 (2)

| Example | II-8 | II-9 | II-10 | II-11 | II-12 | II-13 | II-14 |
|---|---|---|---|---|---|---|---|
| In/(In + Zn + Sn) | 0.90 | 0.90 | 0.80 | 0.80 | 0.80 | 0.90 | 0.90 |
| Zn/(In + Zn + Sn) | 0.10 | 0.10 | — | — | — | — | — |
| Sn/(In + Zn + Sn) | — | — | 0.20 | 0.20 | 0.20 | 0.20 | 0.10 |
| Ru/(In + Zn + Sn + Ru) | — | — | 0.030 | — | — | 0.021 | — |
| Mo/(In + Zn + Sn + Mo) | 0.050 | — | — | 0.070 | — | — | 0.020 |
| V/(In + Zn + Sn + V) | — | 0.070 | — | — | 0.050 | — | — |
| Density of Sintered Discs (g/cm$^3$) | 6.85 | 6.68 | 6.72 | 6.76 | 6.56 | 6.81 | 6.85 |
| Bulk Resistance (mΩ·cm) | 1.85 | 4.85 | 0.74 | 0.92 | 1.92 | 0.79 | 0.93 |

TABLE II-1 (3)

| Example | II-15 | II-16 | II-17 | II-18 | II-19 | II-20 | II-21 |
|---|---|---|---|---|---|---|---|
| In/(In + Zn + Sn) | 0.90 | 0.80 | 0.80 | 0.80 | 0.90 | 0.90 | 0.90 |
| Zn/(In + Zn + Sn) | — | 0.10 | 0.10 | 0.10 | 0.07 | 0.07 | 0.07 |
| Sn/(In + Zn + Sn) | 0.10 | 0.10 | 0.10 | 0.10 | 0.03 | 0.03 | 0.03 |
| Ru/(In + Zn + Sn + Ru) | — | 0.022 | — | — | 0.025 | — | — |
| Mo/(In + Zn + Sn + Mo) | — | — | 0.050 | — | — | 0.035 | — |
| V/(In + Zn + Sn + V) | 0.020 | — | — | 0.050 | — | — | 0.035 |
| Density of Sintered Discs (g/cm$^3$) | 6.55 | 6.74 | 6.78 | 6.57 | 6.71 | 6.78 | 6.58 |
| Bulk Resistance (mΩ·cm) | 1.93 | 0.92 | 1.85 | 1.85 | 0.98 | 1.98 | 1.98 |

TABLE II-2 (1)

| Example | Specific Resistance of Film (mΩ·cm) | Light Transmittance (%) | Crystallinity | Work Function (eV) |
|---|---|---|---|---|
| II-1 | 0.84 | 79 | micro-crystalline | 5.51 |
| II-2 | 1.51 | 80 | micro-crystalline | 5.48 |
| II-3 | 4.10 | 79 | micro-crystalline | 5.49 |
| II-4 | 1.70 | 79 | amorphous | 5.52 |
| II-5 | 2.80 | 76 | amorphous | 5.46 |
| II-6 | 3.70 | 79 | amorphous | 5.47 |
| II-7 | 1.20 | 79 | amorphous | 5.45 |
| II-8 | 2.10 | 77 | amorphous | 5.48 |
| II-9 | 3.12 | 80 | amorphous | 5.50 |
| II-10 | 0.70 | 81 | micro-crystalline | 5.52 |

TABLE II-2 (2)

| Example | Specific Resistance of Film (mΩ·cm) | Light Transmittance (%) | Crystallinity | Work Function (eV) |
|---|---|---|---|---|
| II-11 | 1.47 | 78 | micro-crystalline | 5.50 |
| II-12 | 3.74 | 80 | micro-crystalline | 5.48 |
| II-13 | 0.71 | 80 | micro-crystalline | 5.47 |
| II-14 | 1.56 | 76 | micro-crystalline | 5.46 |
| II-15 | 2.65 | 78 | micro-crystalline | 5.47 |
| II-16 | 0.65 | 78 | amorphous | 5.54 |
| II-17 | 2.56 | 74 | amorphous | 5.48 |
| II-18 | 3.62 | 76 | amorphous | 5.49 |
| II-19 | 0.72 | 79 | amorphous | 5.55 |
| II-20 | 1.27 | 76 | amorphous | 5.50 |

TABLE II-2 (3)

| Example (Comparative Example) | Specific Resistance of Film (mΩ·cm) | Light Transmittance (%) | Crystallinity | Work Function (eV) |
|---|---|---|---|---|
| II-21 | 4.27 | 75 | amorphous | 5.51 |
| II-22 | 1.40 | 80 | amorphous | 5.53 |
| II-23 | 0.71 | 81 | crystalline | 5.52 |
| II-24 | 0.84 | 80 | amorphous | 5.51 |
| II-25 | 1.70 | 78 | amorphous | 5.51 |
| (II-1) | 0.34 | 80 | amorphous | 5.18 |
| (II-2) | 0.18 | 82 | crystalline | 4.97 |

Third Aspect of the Invention

EXAMPLE III-1

(1) Production of Transparent Electroconductive Material:

Raw material powders of indium oxide, tin oxide and iridium oxide were fed into a wet ball mill in the following atomic ratios:

In/(In+Zn+Sn)=0.90

Zn/(In+Zn+Sn)=0.00

Sn/(In+Zn+Sn)=0.10, and

Ir/(In+Zn+Sn+Ir)=0.04, and mixed and ground therein for 72 hours to prepare powder of a transparent electroconductive material.

The atomic ratio of the metal atoms constituting the transparent electroconductive material obtained herein is given in Table III-1.

(2) Production of Sintered Discs

The powdery, transparent electroconductive material obtained in (1) was granulated, and then pressed into discs having a diameter of 4 inches and a thickness of 5 mm. The discs were put into a baking furnace and baked therein under pressure at 1400° C. for 36 hours.

The sintered discs had a density of 6.8 g/cm$^3$ and a bulk resistance of 0.98 mΩ.cm.

The physical properties of the sintered discs were measured, and the data are given in Table III-1.

(3) Production of Transparent Electroconductive Glass

The sintered product having been prepared in (2) was formed into sputtering targets having a diameter of 4 inches and a thickness of 5 mm. The target was set in a DC magnetron sputtering unit, and sputtered onto a glass substrate set therein.

Regarding the sputtering condition, the atmosphere in the unit was argon gas combined with a suitable amount of oxygen gas; the sputtering pressure was $3 \times 10^{-1}$ Pa; the ultimate vacuum degree was $5 \times 10^{-4}$ Pa; the substrate temperature was 25° C.; the power applied was 80 W; the time for film deposition was 14 minutes.

The transparent electroconductive film formed on the glass substrate had a thickness of 1,200 angstroms, and was amorphous. Its light transmittance for light having a wavelength of 500 nm was measured with a spectrophotometer, and was 81%. The specific resistance of the film, measured according to a 4-probe method, was 1.2 mΩ.cm, and the electroconductivity of the film was high. The work function of the film was measured through V photoelectron spectrometry, and was 5.46 electron volts.

The physical properties of the transparent electroconductive film are given in Table III-2.

EXAMPLE III-2
(1) Production of Transparent Electroconductive Glass

The same sputtering target as in Example III-1 was used, and transparent electroconductive glass was produced in the same manner as in the step (3) in Example III-1. In this, however, the substrate temperature was 215° C.

The physical properties of the transparent electroconductive film formed on the glass substrate were measured, and the data are given in Table III-2.

EXAMPLE III-3
(1) Production of Transparent Electroconductive Material

Raw material powders of indium oxide, tin oxide and iridium oxide were fed into a wet ball mill in the following atomic ratios:

$In/(In+Zn+Sn)=0.70$ $Zn/(In+Zn+Sn)=0.00$ $Sn/(In+Zn+Sn)=0.30$, and $Ir/(In+Zn+Sn+Ir)=0.08$, and mixed and ground therein for 72 hours to prepare powder of a transparent electroconductive material.

The atomic ratio of the metal atoms constituting the transparent electroconductive material obtained herein is given in Table III-1.

(2) Production of Sintered Discs

From the powdery, transparent electroconductive material obtained in (1), produced were sintered discs in the same manner as in the step (2) in Example III-1.

The physical properties of the sintered discs were measured, and the data are given in Table III-1.

(3) Production of Transparent Electroconductive Glass

Transparent electroconductive glass was produced in the same manner as in the step (3) in Example III-1. In this, however, used was the sintered product that had been prepared in the previous step (2). The physical properties of the transparent electroconductive film formed on the glass substrate were measured, and the data are given in Table III-2.

EXAMPLE III-4
(1) Production of Transparent Electroconductive Material

Raw material powders of indium oxide, tin oxide and iridium oxide were fed into a wet ball mill in the following atomic ratios:

$In/(In+Zn+Sn)=0.25$ $Zn/(In+Zn+Sn)=0.00$ $Sn/(In+Zn+Sn)=0.75$, and $Ir/(In+Zn+Sn+Ir)=0.05$, and mixed and ground therein for 72 hours to prepare powder of a transparent electroconductive material.

The atomic ratio of the metal atoms constituting the transparent electroconductive material obtained herein is given in Table III-1.

(2) Production of Sintered Discs

From the powdery, transparent electroconductive material obtained in (1), produced were sintered discs in the same manner as in the step (2) in Example III-1.

The physical properties of the sintered discs were measured, and the data are given in Table III-1.

(3) Production of Transparent Electroconductive Glass

Transparent electroconductive glass was produced in the same manner as in the step (3) in Example III-1. In this, however, used was the sintered product that had been prepared in the previous step (2). The physical properties of the transparent electroconductive film formed on the glass substrate were measured, and the data are given in Table III-2.

EXAMPLE III-5
(1) Production of Transparent Electroconductive Material

Raw material powders of indium oxide and iridium oxide were fed into a wet ball mill in the following atomic ratios:

$In/(In+Zn+Sn)=1.00$ $Zn/(In+Zn+Sn)=0.00$ $Sn/(In+Zn+Sn)=0.00$, and $Ir/(In+Zn+Sn+Ir)=0.04$, and mixed and ground therein for 72 hours to prepare powder of a transparent electroconductive material.

The atomic ratio of the metal atoms constituting the transparent electroconductive material obtained herein is given in Table III-1.

(2) Production of Sintered Discs

From the powdery, transparent electroconductive material obtained in (1), produced were sintered discs in the same manner as in the step (2) in Example III-1.

The physical properties of the sintered discs were measured, and the data are given in Table III-1.

(3) Production of Transparent Electroconductive Glass

Transparent electroconductive glass was produced in the same manner as in the step (3) in Example III-1. In this, however, used was the sintered product that had been prepared in the previous step (2). The physical properties of the transparent electroconductive film formed on the glass substrate were measured, and the data are given in Table III-2.

EXAMPLE III-6

(1) Production of Transparent Electroconductive Material

Raw material powders of zinc oxide, tin oxide and iridium oxide were fed into a wet ball mill in the following atomic ratios:

In/(In+Zn+Sn)=0.00

Zn/(In+Zn+Sn)=0.20

Sn/(In+Zn+Sn)=0.80, and

Ir/(In+Zn+Sn+Ir)=0.05, and mixed and ground therein for 72 hours to prepare powder of a transparent electroconductive material.

The atomic ratio of the metal atoms constituting the transparent electroconductive material obtained herein is given in Table III-1.

(2) Production of Sintered Discs

From the powdery, transparent electroconductive material obtained in (1), produced were sintered discs in the same manner as in the step (2) in Example III-1.

The physical properties of the sintered discs were measured, and the data are given in Table III-1.

(3) Production of Transparent Electroconductive Glass

Transparent electroconductive glass was produced in the same manner as in the step (3) in Example III-1. In this, however, used was the sintered product that had been prepared in the previous step (2). The physical properties of the transparent electroconductive film formed on the glass substrate were measured, and the data are given in Table III-2.

EXAMPLE III-7

(1) Production of Transparent Electroconductive Material

Raw material powders of indium oxide, zinc oxide, tin oxide and iridium oxide were fed into a wet ball mill in the following atomic ratios:

In/(In+Zn+Sn)=0.80

Zn/(In+Zn+Sn)=0.10

Sn/(In+Zn+Sn)=0.10, and

Ir/(In+Zn+Sn+Ir)=0.06, and mixed and ground therein for 72 hours to prepare powder of a transparent electroconductive material.

The atomic ratio of the metal atoms constituting the transparent electroconductive material obtained herein is given in Table III-1.

(2) Production of Sintered Discs

From the powdery, transparent electroconductive material obtained in (1), produced were sintered discs in the same manner as in the step (2) in Example III-1.

The physical properties of the sintered discs were measured, and the data are given in Table III-1.

(3) Production of Transparent Electroconductive Glass

Transparent electroconductive glass was produced in the same manner as in the step (3) in Example III-1. In this, however, used was the sintered product that had been prepared in the previous step (2). The physical properties of the transparent electroconductive film formed on the glass substrate were measured, and the data are given in Table III-2.

EXAMPLE III-8

(1) Production of Transparent Electroconductive Material

Raw material powders of indium oxide, zinc oxide, tin oxide and iridium oxide were fed into a wet ball mill in the following atomic ratios:

In/(In+Zn+Sn)=0.05

Zn/(In+Zn+Sn)=0.90

Sn/(In+Zn+Sn)=0.05, and

Ir/(In+Zn+Sn+Ir)=0.06, and mixed and ground therein for 72 hours to prepare powder of a transparent electroconductive material.

The atomic ratio of the metal atoms constituting the transparent electroconductive material obtained herein is given in Table III-1.

(2) Production of Sintered Discs

From the powdery, transparent electroconductive material obtained in (1), produced were sintered discs in the same manner as in the step (2) in Example III-1.

The physical properties of the sintered discs were measured, and the data are given in Table III-1.

(3) Production of Transparent Electroconductive Glass

Transparent electroconductive glass was produced in the same manner as in the step (3) in Example III-1. In this, however, used was the sintered product that had been prepared in the previous step (2). The physical properties of the transparent electroconductive film formed on the glass substrate were measured, and the data are given in Table III-2.

EXAMPLE III-9

(1) Production of Transparent Electroconductive Material

Raw material powders of indium oxide, zinc oxide and iridium oxide were fed into a wet ball mill in the following atomic ratios:

In/(In+Zn+Sn)=0.85

Zn/(In+Zn+Sn)=0.15

Sn/(In+Zn+Sn)=0.00, and

Ir/(In+Zn+Sn+Ir)=0.06, and mixed and ground therein for 72 hours to prepare powder of a transparent electroconductive material.

The atomic ratio of the metal atoms constituting the transparent electroconductive material obtained herein is given in Table III-1.

(2) Production of Sintered Discs

From the powdery, transparent electroconductive material obtained in (1), produced were sintered discs in the same manner as in the step (2) in Example III-1.

The physical properties of the sintered discs were measured, and the data are given in Table III-1.

(3) Production of Transparent Electroconductive Glass

Transparent electroconductive glass was produced in the same manner as in the step (3) in Example III-1. In this, however, used was the sintered product that had been prepared in the previous step (2). The physical properties of the transparent electroconductive film formed on the glass substrate were measured, and the data are given in Table III-2.

EXAMPLE III-10

(1) Production of Transparent Electroconductive Glass

The same sputtering target as in Example III-9 was used, and transparent electroconductive glass was produced in the same manner as in the step (3) in Example III-1. In this, however, the substrate temperature was 215° C.

The physical properties of the transparent electroconductive film formed on the glass substrate were measured, and the data are given in Table III-2.

EXAMPLE III-11

(1) Production of Transparent Electroconductive Film

The same sputtering target as in Example III-10 was used, and a transparent electroconductive film was produced in the same manner as in the step (3) in Example III-1. In this, however, a transparent resin film of polycarbonate was used as the substrate in place of the glass substrate.

The physical properties of the transparent electroconductive film formed on the resin substrate were measured, and the data are given in Table III-2.

EXAMPLE III-12

(1) Production of Transparent Electroconductive Material

Raw material powders of indium oxide, tin oxide and rhenium oxide were fed into a wet ball mill in the following atomic ratios:

$In/(In+Zn+Sn)=0.90$ $Zn/(In+Zn+Sn)=0.00$ $Sn/(In+Zn+Sn)=0.10$, and $Re/(In+Zn+Sn+Re)=0.04$, and mixed and ground therein for 72 hours to prepare powder of a transparent electroconductive material.

The atomic ratio of the metal atoms constituting the transparent electroconductive material obtained herein is given in Table III-1.

(2) Production of Sintered Discs

From the powdery, transparent electroconductive material obtained in (1), produced were sintered discs in the same manner as in the step (2) in Example III-1.

The physical properties of the sintered discs were measured, and the data are given in Table III-1.

(3) Production of Transparent Electroconductive Glass

Transparent electroconductive glass was produced in the same manner as in the step (3) in Example III-1. In this, however, used was the sintered product that had been prepared in the previous step (2). The physical properties of the transparent electroconductive film formed on the glass substrate were measured, and the data are given in Table III-2.

EXAMPLE III-13

(1) Production of Transparent Electroconductive Material

Raw material powders of indium oxide, zinc oxide and rhenium oxide were fed into a wet ball mill in the following atomic ratios:

$In/(In+Zn+Sn)=0.85$ $Zn/(In+Zn+Sn)=0.15$ $Sn/(In+Zn+Sn)=0.00$ and $Re/(In+Zn+Sn+Re)=0.06$, and mixed and ground therein for 72 hours to prepare powder of a transparent electroconductive material.

The atomic ratio of the metal atoms constituting the transparent electroconductive material obtained herein is given in Table III-1.

(2) Production of Sintered Discs

From the powdery, transparent electroconductive material obtained in (1), produced were sintered discs in the same manner as in the step (2) in Example III-1.

The physical properties of the sintered discs were measured, and the data are given in Table III-1.

(3) Production of Transparent Electroconductive Glass

Transparent electroconductive glass was produced in the same manner as in the step (3) in Example III-1. In this, however, used was the sintered product that had been prepared in the previous step (2). The physical properties of the transparent electroconductive film formed on the glass substrate were measured, and the data are given in Table III-2.

EXAMPLE III-14

(1) Production of Transparent Electroconductive Film

The same sputtering target as in Example III-13 was used, and a transparent electroconductive film was produced in the same manner as in the step (3) in Example III-1. In this, however, a transparent resin film of polycarbonate was used as the substrate in place of the glass substrate.

The physical properties of the transparent electroconductive film formed on the resin substrate were measured, and the data are given in Table III-2.

EXAMPLE III-15

(1) Production of Transparent Electroconductive Material

Raw material powders of indium oxide, zinc oxide, tin oxide and rhenium oxide were fed into a wet ball mill in the following atomic ratios:

$In/(In+Zn+Sn)=0.80$ $Zn/(In+Zn+Sn)=0.10$ $Sn/(In+Zn+Sn)=0.10$, and $Re/(In+Zn+Sn+Re)=0.05$, and mixed and ground therein for 72 hours to prepare powder of a transparent electroconductive material.

The atomic ratio of the metal atoms constituting the transparent electroconductive material obtained herein is given in Table III-1.

(2) Production of Sintered Discs

From the powdery, transparent electroconductive material obtained in (1), produced were sintered discs in the same manner as in the step (2) in Example III-1.

The physical properties of the sintered discs were measured, and the data are given in Table III-1.

(3) Production of Transparent Electroconductive Glass

Transparent electroconductive glass was produced in the same manner as in the step (3) in Example III-1. In this, however, used was the sintered product that had been prepared in the previous step (2). The physical properties of the transparent electroconductive film formed on the glass substrate were measured, and the data are given in Table III-2.

EXAMPLE III-16

(1) Production of Transparent Electroconductive Material

Raw material powders of indium oxide, zinc oxide and palladium oxide were fed into a wet ball mill in the following atomic ratios:

In/(In+Zn+Sn)=0.80

Zn/(In+Zn+Sn)=0.20

Sn/(In+Zn+Sn)=0.00, and

Pd/(In+Zn+Sn+Pd)=0.05, and mixed and ground therein for 72 hours to prepare powder of a transparent electroconductive material.

The atomic ratio of the metal atoms constituting the transparent electroconductive material obtained herein is given in Table III-1.

(2) Production of Sintered Discs

From the powdery, transparent electroconductive material obtained in (1), produced were sintered discs in the same manner as in the step (2) in Example III-1.

The physical properties of the sintered discs were measured, and the data are given in Table III-1.

(3) Production of Transparent Electroconductive Glass

Transparent electroconductive glass was produced in the same manner as in the step (3) in Example III-1. In this, however, used was the sintered product that had been prepared in the previous step (2). The physical properties of the transparent electroconductive film formed on the glass substrate were measured, and the data are given in Table III-2.

COMPARATIVE EXAMPLE III-1

(1) Production of Transparent Electroconductive Material

Raw material powders of indium oxide and zinc oxide were fed into a wet ball mill in the following atomic ratios:

In/(In+Zn)=0.85

Zn/(In+Zn)=0.15, and mixed and ground therein for 72 hours to prepare powder of a transparent electroconductive material.

(2) Production of Sintered Discs

From the transparent electroconductive material obtained in (1), produced were sintered discs in the same manner as in the step (2) in Example III-1.

(3) Production of Transparent Electroconductive Glass

Transparent electroconductive glass was produced in the same manner as in the step (3) in Example III-1. In this, however, used was the sintered product that had been prepared in the previous step (2). The physical properties of the transparent electroconductive film formed on the glass substrate were measured, and the data are given in Table III-2.

COMPARATIVE EXAMPLE III-2

(1) Production of Transparent Electroconductive Material

Raw material powders of indium oxide and tin oxide were fed into a wet ball mill in the following atomic ratios:

In/(In+Sn)=0.90

Sn/(In+Sn)=0.10, and mixed and ground therein for 72 hours to prepare powder of a transparent electroconductive material.

(2) Production of Sintered Discs

From the transparent electroconductive material obtained in (1), produced were sintered discs in the same manner as in the step (2) in Example III-1.

(3) Production of Transparent Electroconductive Glass

Transparent electroconductive glass was produced in the same manner as in the step (3) in Example III-1. In this, however, used was the sintered product that had been prepared in the previous step (2), and the glass substrate temperature was 215° C. The physical properties of the transparent electroconductive film formed on the glass substrate were measured, and the data are given in Table III-2.

TABLE III-1 (1)

| Example | III-1 | III-3 | III-4 | III-5 | III-6 | III-7 | III-8 |
|---|---|---|---|---|---|---|---|
| In/(In + Zn + Sn) | 0.90 | 0.70 | 0.25 | 1.0 | — | 0.80 | 0.05 |
| Zn/(In + Zn + Sn) | — | — | — | — | 0.20 | 0.10 | 0.90 |
| Sn/(In + Zn + Sn) | 0.10 | 0.30 | 0.75 | — | 0.80 | 0.10 | 0.05 |
| Ir/(In + Zn + Sn + Ir) | 0.04 | 0.08 | 0.05 | 0.04 | 0.05 | 0.06 | 0.06 |
| Re/(In + Zn + Sn + Re) | — | — | — | — | — | — | — |
| Pd/(In + Zn + Sn + Pd) | — | — | — | — | — | — | — |
| Density of Sintered Discs (g/cm$^3$) | 6.8 | 6.6 | 6.3 | 6.7 | 6.2 | 6.8 | 5.8 |
| Bulk Resistance (mΩ · cm) | 0.98 | 1.4 | 4.7 | 0.92 | 8.9 | 0.95 | 8.9 |

TABLE III-1 (2)

| Example (Comparative Example) | III-9 | III-11 | III-12 | III-13 | III-16 | (III-1) | (III-2) |
|---|---|---|---|---|---|---|---|
| In/(In + Zn + Sn) | 0.85 | 0.90 | 0.85 | 0.80 | 0.80 | 0.85 | 0.90 |
| Zn/(In + Zn + Sn) | 0.15 | — | 0.15 | 0.10 | 0.20 | 0.15 | — |
| Sn/(In + Zn + Sn) | — | 0.10 | — | 0.10 | — | — | 0.10 |
| Ir/(In + Zn + Sn + Ir) | 0.06 | — | — | — | — | — | — |
| Re/(In + Zn + Sn + Re) | — | 0.04 | 0.06 | 0.05 | — | — | — |
| Pd/(In + Zn + Sn + Pd) | — | — | — | — | 0.05 | — | — |
| Density of Sintered Discs (g/cm$^3$) | 6.8 | 6.7 | 6.8 | 6.3 | 6.48 | 6.9 | 6.71 |
| Bulk Resistance (mΩ · cm) | 1.0 | 0.85 | 0.94 | 0.73 | 3.4 | 2.4 | 0.69 |

TABLE III-2 (1)

| Example | Substrate Temperature (° C.) | Specific Resistance of Film (mΩ · cm) | Light Transmittance (%) | Crystallinity | Work Function (eV) |
|---|---|---|---|---|---|
| III-1 | 25 | 1.2 | 81 | amorphous | 5.46 |
| III-2 | 215 | 0.52 | 82 | microcrystalline | 5.45 |
| III-3 | 25 | 1.7 | 82 | amorphous | 5.47 |
| III-4 | 25 | 3.8 | 81 | amorphous | 5.48 |
| III-5 | 25 | 0.80 | 80 | amorphous | 5.45 |
| III-6 | 25 | 450 | 80 | amorphous | 5.46 |
| III-7 | 25 | 1.1 | 81 | amorphous | 5.54 |
| III-8 | 25 | 8.8 | 78 | amorphous | 5.48 |
| III-9 | 25 | 1.3 | 82 | amorphous | 5.54 |

TABLE III-2 (2)

| Example (Comparative Example) | Substrate Temperature (° C.) | Specific Resistance of Film (mΩ · cm) | Light Transmittance (%) | Crystallinity | Work Function (eV) |
|---|---|---|---|---|---|
| III-10 | 215 | 0.56 | 80 | amorphous | 5.49 |
| III-11 | 25 | 0.45 | 82 | amorphous | 5.45 |
| III-12 | 25 | 0.64 | 81 | amorphous | 5.48 |
| III-13 | 25 | 0.55 | 82 | amorphous | 5.47 |
| III-14 | 25 | 1.3 | 82 | amorphous | 5.54 |
| III-15 | 25 | 0.64 | 81 | amorphous | 5.48 |
| III-16 | 25 | 360 | 76 | amorphous | 5.61 |
| (III-1) | 25 | 0.32 | 80 | amorphous | 5.18 |
| (III-2) | 215 | 0.18 | 82 | crystalline | 4.95 |

Fourth Aspect of the Invention

EXAMPLE IV-1

(1) Production of Raw Material Powders for Transparent electroconductive material Raw material powders of tin oxide, zinc oxide and vanadium oxide were fed into a wet ball mill in the following atomic ratios:

Sn/(Sn+In+Zn)=0.80

In/(Sn+In+Zn)=0.00

Zn/(Sn+In+Zn)=0.20, and

V/(Sn+In+Zn+V)=0.04, and mixed and ground therein for 72 hours to prepare powder of a transparent electroconductive material.

The atomic ratio of the metal atoms constituting the transparent electroconductive material obtained herein is given in Table IV-1.

(2) Production of Sintered Discs

The powdery, transparent electroconductive material obtained in (1) was granulated, and then pressed into discs having a diameter of 4 inches and a thickness of 5 mm. The discs were put into a baking furnace and baked therein under pressure at 1400° C. for 36 hours.

The sintered discs had a density of 6.8 g/cm³ and a bulk resistance of 6.5 mΩ.cm.

The physical properties of the sintered discs were measured, and the data are given in Table IV-1.

(3) Production of Transparent Electroconductive Glass

The sintered product having been prepared in (1) was formed into sputtering targets [A] having a diameter of 4 inches and a thickness of 5 mm. The target was set in a DC magnetron sputtering unit, and sputtered onto a glass substrate set therein.

Regarding the sputtering condition, the atmosphere in the unit was argon gas combined with a suitable amount of oxygen gas; the sputtering pressure was 3×10⁻¹ Pa; the ultimate vacuum degree was 5×10⁻⁴ Pa; the substrate temperature was 25° C.; the power applied was 100 W; the time for film deposition was 14 minutes.

The transparent electroconductive film formed on the glass substrate had a thickness of 1,200 angstroms, and was amorphous. Its light transmittance for light having a wavelength of 500 nm was measured with a spectrophotometer, and was 80%. The specific resistance of the film, measured according to a 4-probe method, was 1,000 mΩ.cm. The work function of the film was measured through UV photoelectron spectrometry, and was 5.50 electron volts.

The physical properties of the transparent electroconductive film are given in Table IV-2.

EXAMPLE IV-2

Using the same sputtering target [A] as in Example IV-1, transparent electroconductive glass was produced in the same manner as in the step (3) in Example IV-1 except for the sputtering condition. In this, the substrate temperature was 215° C.

The physical properties of the transparent electroconductive film formed on the glass substrate are given in Table IV-2.

EXAMPLE IV-3

(1) Production of Raw Material Powders for Transparent Electroconductive Material Raw material powders for a transparent electroconductive material were prepared in the same manner as in the step (1) in Example IV-1, except that powders of tin oxide, zinc oxide and vanadium oxide were mixed in the atomic ratios indicated in Table IV-1.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-1.

(3) Production of Transparent Electroconductive Glass

Transparent electroconductive glass was produced in the same manner as in the step (3) in Example IV-1, except that the sputtering target [B] of the sintered product having been prepared in the previous (2) was used herein.

The physical properties of the transparent electroconductive film formed herein are given in Table IV-2.

EXAMPLE IV-4

(1) Production of Raw Material Powders for Transparent Electroconductive Material Raw material powders for a transparent electroconductive material were prepared in the same manner as in the step (1) in Example IV-1, except that powders of tin oxide, zinc oxide and vanadium oxide were mixed in the atomic ratios indicated in Table IV-1.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-1.

(3) Production of Transparent Electroconductive Glass

Transparent electroconductive glass was produced in the same manner as in the step (3) in Example IV-1, except that the sputtering target [C] of the sintered product having been prepared in the previous (2) was used herein.

The physical properties of the transparent electroconductive film formed herein are given in Table IV-2.

EXAMPLE IV-5

(1) Production of Raw Material Powders for Transparent Electroconductive Material Raw material powders for a transparent electroconductive material were prepared in the same manner as in the step (1) in Example IV-1, except that powders of tin oxide, indium oxide and vanadium oxide were mixed in the atomic ratios indicated in Table IV-1.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-1.

(3) Production of Transparent Electroconductive Glass

Transparent electroconductive glass was produced in the same manner as in the step (3) in Example IV-1, except that the sputtering target [D] of the sintered product having been prepared in the previous (2) was used herein.

The physical properties of the transparent electroconductive film formed herein are given in Table IV-2.

EXAMPLE IV-6

(1) Production of Raw Material Powders for Transparent Electroconductive Material Raw material powders for a transparent electroconductive material were prepared in the same manner as in the step (1) in Example IV-1, except that powders of tin oxide and vanadium oxide were mixed in the atomic ratios indicated in Table IV-1.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-1.

(3) Production of Transparent Electroconductive Glass

Transparent electroconductive glass was produced in the same manner as in the step (3) in Example IV-1, except that the sputtering target [E] of the sintered product having been prepared in the previous (2) was used herein.

The physical properties of the transparent electroconductive film formed herein are given in Table IV-2.

EXAMPLE IV-7

(1) Production of Raw Material Powders for Transparent Electroconductive Material Raw material powders for a transparent electroconductive material were prepared in the same manner as in the step (1) in Example IV-1, except that powders of tin oxide, indium oxide, zinc oxide and vanadium oxide were mixed in the atomic ratios indicated in Table IV-1.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-1.

(3) Production of Transparent Electroconductive Glass

Transparent electroconductive glass was produced in the same manner as in the step (3) in Example IV-1, except that the sputtering target [F] of the sintered product having been prepared in the previous (2) was used herein.

The physical properties of the transparent electroconductive film formed herein are given in Table IV-2.

EXAMPLE IV-8

(1) Production of Transparent Electroconductive Film

Using a transparent polycarbonate film but not glass as the substrate and using the sputtering target [F] that had been prepared in Example IV-7, a transparent electroconductive film was produced.

The physical properties of the transparent electroconductive film formed herein are given in Table IV-2.

EXAMPLE IV-9

(1) Production of Raw Material Powders for Transparent Electroconductive Material Raw material powders for a transparent electroconductive material were prepared in the same manner as in the step (1) in Example IV-1, except that powders of tin oxide, indium oxide, zinc oxide and vanadium oxide were mixed in the atomic ratios indicated in Table IV-1.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-1.

(3) Production of Transparent Electroconductive Glass

Transparent electroconductive glass was produced in the same manner as in the step (3) in Example IV-1, except that the sputtering target [G] of the sintered product having been prepared in the previous (2) was used herein.

The physical properties of the transparent electroconductive film formed herein are given in Table IV-2.

Comparative Example IV-1

(1) Production of Raw Material Powders for Transparent Electroconductive Material Raw material powders for a transparent electroconductive material were prepared in the same manner as in the step (1) in Example IV-1, except that powders of indium oxide and zinc oxide were mixed in the atomic ratios indicated in Table IV-1.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-1.

(3) Production of Transparent Electroconductive Glass

Transparent electroconductive glass was produced in the same manner as in the step (3) in Example IV-1, except that the sputtering target [H] of the sintered product having been prepared in the previous (2) was used herein.

The physical properties of the transparent electroconductive film formed herein are given in Table IV-2.

Comparative Example IV-2

(1) Production of Raw Material Powders for Transparent Electroconductive Material Raw material powders for a transparent electroconductive material were prepared in the same manner as in the step (1) in Example IV-1, except that powders of tin oxide and indium oxide were mixed in the atomic ratios indicated in Table IV-1.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-1.

(3) Production of Transparent Electroconductive Glass

Transparent electroconductive glass was produced in the same manner as in the step (3) in Example IV-1, except that the sputtering target [I] of the sintered product having been prepared in the previous (2) was used herein.

The physical properties of the transparent electroconductive film formed herein are given in Table IV-2.

Comparative Example IV-3

(1) Production of Transparent Electroconductive Glass

Transparent electroconductive glass was produced in the same manner as in the step (3) in Example IV-1. In this, however, the sputtering target [H] that had been prepared in Comparative Example IV-1 was used, and the temperature of the glass substrate in the sputtering step was 215° C.

The physical properties of the transparent electroconductive film formed herein are given in Table IV-2.

Comparative Example IV-4

(1) Production of Transparent Electroconductive Glass

Transparent electroconductive glass was produced in the same manner as in the step (3) in Example IV-1. In this, however, the sputtering target [I] that had been prepared in Comparative Example IV-2 was used, and the temperature of the glass substrate in the sputtering step was 215° C.

The physical properties of the transparent electroconductive film formed herein are given in Table IV-2.

TABLE IV-1

| Example (Comparative Example) | IV-1 | IV-3 | IV-4 | IV-5 | IV-6 | IV-7 | IV-9 | (IV-1) | (IV-2) |
|---|---|---|---|---|---|---|---|---|---|
| Sn/(Sn + In + Zn) | 0.80 | 0.95 | 0.55 | 0.80 | 1.00 | 0.80 | 0.80 | — | 0.10 |
| In/(Sn + In + Zn) | — | — | 0.45 | 0.20 | — | 0.10 | 0.15 | 0.85 | 0.90 |
| Zn/(Sn + In + Zn) | 0.20 | 0.05 | — | — | — | 0.10 | 0.05 | 0.15 | — |
| V/(Sn + In + Zn + V) | 0.04 | 0.032 | 0.035 | 0.03 | 0.02 | 0.05 | 0.035 | — | — |
| Density of Sintered Discs (g/cm$^3$) | 6.8 | 6.6 | 6.5 | 6.6 | 6.5 | 6.7 | 6.6 | 6.75 | 6.71 |
| Bulk Resistance (mΩ · cm) | 6.5 | 5.8 | 8.3 | 6.8 | 8.1 | 3.8 | 4.2 | 2.74 | 0.69 |
| Target Code | [A] | [B] | [C] | [D] | [E] | [F] | [G] | [H] | [I] |

TABLE IV-2

| Example (Comparative Example) | Target Code | Substrate Temperature (° C.) | Specific Resistance of Film (mΩ · cm) | Light Transmittance (%) | Crystallinity | Work Function (eV) |
|---|---|---|---|---|---|---|
| IV-1 | [A] | 25 | 1000 | 80 | amorphous | 5.50 |
| IV-2 | [A] | 215 | 1000 | 81 | crystalline | 5.51 |
| IV-3 | [B] | 25 | 700 | 80 | amorphous | 5.49 |
| IV-4 | [C] | 25 | 3 | 81 | amorphous | 5.48 |
| IV-5 | [D] | 25 | 5 | 80 | amorphous | 5.47 |
| IV-6 | [E] | 25 | 4 | 81 | amorphous | 5.46 |
| IV-7 | [F] | 25 | 1 | 82 | amorphous | 5.48 |
| IV-8 | [F] | 25 | 1 | 82 | amorphous | 5.48 |
| IV-9 | [G] | 25 | 2 | 81 | amorphous | 5.48 |
| (IV-1) | [H] | 25 | 0.34 | 80 | amorphous | 5.18 |
| (IV-2) | [I] | 25 | 0.42 | 80 | micro-crystalline | 4.97 |
| (IV-3) | [H] | 215 | 0.32 | 80 | amorphous | 5.18 |
| (IV-4) | [I] | 215 | 0.18 | 82 | crystalline | 4.95 |

EXAMPLE IV-10

(1) Production of Raw Material Powders for Transparent Electroconductive Material Raw material powders for a transparent electroconductive material were prepared in the same manner as in the step (1) in Example IV-1, except that powders of tin oxide, zinc oxide and molybdenum oxide were mixed in the atomic ratios indicated in Table IV-3.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-3.

(3) Production of Transparent Electroconductive Glass

Transparent electroconductive glass was produced in the same manner as in the step (3) in Example IV-1, except that the sputtering target [J] of the sintered product having been prepared in the previous (2) was used herein.

The physical properties of the transparent electroconductive film formed herein are given in Table IV-4.

EXAMPLE IV-11

(1) Production of Raw Material Powders for Transparent Electroconductive Material Raw material powders for a transparent electroconductive material were prepared in the same manner as in the step (1) in Example IV-1, except that powders of tin oxide, zinc oxide and molybdenum oxide were mixed in the atomic ratios indicated in Table IV-3.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-3.

(3) Production of Transparent Electroconductive Glass

Transparent electroconductive glass was produced in the same manner as in the step (3) in Example IV-1, except that the sputtering target [K] of the sintered product having been prepared in the previous (2) was used herein.

The physical properties of the transparent electroconductive film formed herein are given in Table IV-4.

EXAMPLE IV-12

(1) Production of Raw Material Powders for Transparent Electroconductive Material Raw material powders for a transparent electroconductive material were prepared in the same manner as in the step (1) in Example IV-1, except that powders of tin oxide, indium oxide and molybdenum oxide were mixed in the atomic ratios indicated in Table IV-3.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-3.

(3) Production of Transparent Electroconductive Glass

Transparent electroconductive glass was produced in the same manner as in the step (3) in Example IV-1, except that the sputtering target [L] of the sintered product having been prepared in the previous (2) was used herein.

The physical properties of the transparent electroconductive film formed herein are given in Table IV-4.

EXAMPLE IV-13

(1) Production of Raw Material Powders for Transparent Electroconductive Material Raw material powders for a transparent electroconductive material were prepared in the same manner as in the step (1) in Example IV-1, except that powders of tin oxide, indium oxide, zinc oxide and molybdenum oxide were mixed in the atomic ratios indicated in Table IV-3.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-3.

(3) Production of Transparent Electroconductive Glass

Transparent electroconductive glass was produced in the same manner as in the step (3) in Example IV-1, except that the sputtering target [M] of the sintered product having been prepared in the previous (2) was used herein.

The physical properties of the transparent electroconductive film formed herein are given in Table IV-4.

EXAMPLE IV-14

(1) Production of Transparent Electroconductive Glass

Using the sputtering target [M] that had been prepared in Example IV-13, transparent electroconductive glass was produced in the same manner as in the step (3) in Example IV-1. In this, however, the glass substrate temperature was 215° C.

The physical properties of the transparent electroconductive film formed herein are given in Table IV-4.

EXAMPLE IV-15

(1) Production of Transparent Electroconductive Film

Using a transparent polycarbonate film but not glass as the substrate and using the sputtering target [M] that had been prepared in Example IV-13, a transparent electroconductive film was produced in the same manner as in the step (3) in Example IV-1.

The physical properties of the transparent electroconductive film formed herein are given in Table IV-4.

EXAMPLE IV-16

(1) Production of Raw Material Powders for Transparent Electroconductive Material Raw material powders for a transparent electroconductive material were prepared in the same manner as in the step (1) in Example IV-1, except that powders of tin oxide, indium oxide, zinc oxide and molybdenum oxide were mixed in the atomic ratios indicated in Table IV-3.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-3.

(3) Production of Transparent Electroconductive Glass

Transparent electroconductive glass was produced in the same manner as in the step (3) in Example IV-1, except that the sputtering target [N] of the sintered product having been prepared in the previous (2) was used herein.

The physical properties of the transparent electroconductive film formed herein are given in Table IV-4.

TABLE IV-3

| Example | IV-10 | IV-11 | IV-12 | IV-13 | IV-16 |
|---|---|---|---|---|---|
| Sn/(Sn + In + Zn) | 0.80 | 0.95 | 0.80 | 0.80 | 0.80 |
| In/(Sn + In + Zn) | — | — | 0.20 | 0.10 | 0.15 |
| Zn/(Sn + In + Zn) | 0.20 | 0.05 | — | 0.10 | 0.05 |
| Mo/(Sn + In + Zn + Mo) | 0.04 | 0.032 | 0.03 | 0.05 | 0.04 |
| Density of Sintered Discs (g/cm$^3$) | 6.7 | 6.5 | 6.7 | 6.8 | 6.7 |
| Bulk Resistance (mΩ · cm) | 5.3 | 4.9 | 5.2 | 3.6 | 3.8 |
| Target Code | [J] | [K] | [L] | [M] | [N] |

TABLE IV-4

| Example | Target Code | Substrate Temperature (° C.) | Specific Resistance of Film (mΩ · cm) | Light Transmittance (%) | Crystallinity | Work Function (eV) |
|---|---|---|---|---|---|---|
| IV-10 | [J] | 25 | 850 | 80 | amorphous | 5.47 |
| IV-11 | [K] | 25 | 650 | 81 | crystalline | 5.49 |
| IV-12 | [L] | 25 | 8 | 80 | amorphous | 5.49 |
| IV-13 | [M] | 25 | 1 | 81 | amorphous | 5.48 |
| IV-14 | [M] | 215 | 0.8 | 80 | amorphous | 5.47 |
| IV-15 | [M] | 25 | 1 | 81 | amorphous | 5.48 |
| IV-16 | [N] | 25 | 2 | 81 | amorphous | 5.46 |

EXAMPLE IV-17

(1) Production of Raw Material Powders for Transparent Electroconductive Material Raw material powders for a transparent electroconductive material were prepared in the same manner as in the step (1) in Example IV-1, except that powders of tin oxide, zinc oxide and ruthenium oxide were mixed in the atomic ratios indicated in Table IV-5.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-5.

(3) Production of Transparent Electroconductive Glass

Transparent electroconductive glass was produced in the same manner as in the step (3) in Example IV-1, except that the sputtering target [O] of the sintered product having been prepared in the previous (2) was used herein.

The physical properties of the transparent electroconductive film formed herein are given in Table IV-6.

EXAMPLE IV-18

(1) Production of Raw Material Powders for Transparent Electroconductive Material Raw material powders for a transparent electroconductive material were prepared in the same manner as in the step (1) in Example IV-1, except that powders of tin oxide, zinc oxide and ruthenium oxide were mixed in the atomic ratios indicated in Table IV-5.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-5.

(3) Production of Transparent Electroconductive Glass

Transparent electroconductive glass was produced in the same manner as in the step (3) in Example IV-1, except that the sputtering target [P] of the sintered product having been prepared in the previous (2) was used herein.

The physical properties of the transparent electroconductive film formed herein are given in Table IV-6.

EXAMPLE IV-19

(1) Production of Raw Material Powders for Transparent Electroconductive Material Raw material powders for a transparent electroconductive material were prepared in the same manner as in the step (1) in Example IV-1, except that powders of tin oxide, indium oxide and ruthenium oxide were mixed in the atomic ratios indicated in Table IV-5.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-5.

(3) Production of Transparent Electroconductive Glass

Transparent electroconductive glass was produced in the same manner as in the step (3) in Example IV-1, except that the sputtering target [Q] of the sintered product having been prepared in the previous (2) was used herein.

The physical properties of the transparent electroconductive film formed herein are given in Table IV-6.

EXAMPLE IV-20

(1) Production of Raw Material Powders for Transparent Electroconductive Material Raw material powders for a transparent electroconductive material were prepared in the same manner as in the step (1) in Example IV-1, except that powders of tin oxide, indium oxide, zinc oxide and ruthenium oxide were mixed in the atomic ratios indicated in Table IV-5.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-5.

(3) Production of Transparent Electroconductive Glass

Transparent electroconductive glass was produced in the same manner as in the step (3) in Example IV-1, except that the sputtering target [R] of the sintered product having been prepared in the previous (2) was used herein.

The physical properties of the transparent electroconductive film formed herein are given in Table IV-6.

EXAMPLE IV-21

(1) Production of Transparent Electroconductive Glass

Using the sputtering target [RI] that had been prepared in Example IV-20, transparent electroconductive glass was produced in the same manner as in the step (3) in Example IV-1. In this, however, the glass substrate temperature was 215° C.

The physical properties of the transparent electroconductive film formed herein are given in Table IV-6.

EXAMPLE IV-22

(1) Production of Transparent Electroconductive Film

Using a transparent polycarbonate film but not glass as the substrate and using the sputtering target [R] that had been prepared in Example IV-20, a transparent electroconductive film was produced in the same manner as in the step (3) in Example IV-1.

The physical properties of the transparent electroconductive film formed herein are given in Table IV-6.

EXAMPLE IV-23

(1) Production of Raw Material Powders for Transparent Electroconductive Material Raw material powders for a transparent electroconductive material were prepared in the same manner as in the step (1) in Example IV-1, except that powders of tin oxide, indium oxide, zinc oxide and ruthenium oxide were mixed in the atomic ratios indicated in Table IV-5.

(2) Production of Sintered Discs

Sintered discs were produced in the same manner as in the step (2) in Example IV-1, except that the powdery, transparent electroconductive material having been prepared in the previous (1) was used herein.

The physical properties of the sintered discs were measured, and the data are given in Table IV-5.

(3) Production of Transparent Electroconductive Glass

Transparent electroconductive glass was produced in the same manner as in the step (3) in Example IV-1, except that the sputtering target [S] of the sintered product having been prepared in the previous (2) was used herein.

The physical properties of the transparent electroconductive film formed herein are given in Table IV-6.

TABLE IV-5

| Example | IV-17 | IV-18 | IV-19 | IV-20 | IV-23 |
|---|---|---|---|---|---|
| Sn/(Sn + In + Zn) | 0.80 | 0.95 | 0.80 | 0.80 | 0.80 |
| In/(Sn + In + Zn) | — | — | 0.20 | 0.10 | 0.15 |
| Zn/(Sn + In + Zn) | 0.20 | 0.05 | — | 0.10 | 0.05 |
| Ru/(Sn + In + Zn + Ru) | 0.04 | 0.032 | 0.03 | 0.05 | 0.04 |
| Density of Sintered Discs (g/cm$^3$) | 6.5 | 6.4 | 6.6 | 6.7 | 6.7 |
| Bulk Resistance (mΩ · cm) | 4.2 | 5.6 | 4.25 | 3.4 | 3.6 |
| Target Code | [O] | [P] | [Q] | [R] | [S] | formed into films in a stable and efficient manner through sputtering or the like, sputtering targets of the sintered products, and transparent electroconductive glass and films formed from the targets. The transparent electroconductive glass and films have good transparency, good electroconductivity and good workability into electrodes, and are therefore favorable to transparent electrodes in organic electroluminescent devices as realizing good hole injection efficiency therein.

What is claimed is:

1. A sintered product of a composition that comprises indium oxide, or indium oxide and zinc oxide and/or tin oxide in the following atomic ratios:

In/(In+Zn+Sn)=0.80 to 1.00,

Zn/(In+Zn+Sn)=0.05 to 0.20,

Sn/(In+Zn+Sn)=0.02 to 0.20, and contains from 0.5 to 10 atomic %, relative to the total of all metal atoms therein, of a metal oxide selected from ruthenium oxide, molybdenum oxide and vanadium oxide.

2. A sputtering target comprising the sintered product of claim 1.

3. An electron-beaming target comprising the sintered product of claim 1.

4. An ion-plating target comprising the sintered product of claim 1.

5. Transparent electroconductive glass prepared by coating the surface of glass with a transparent electroconductive film of a composition that comprises indium oxide, zinc oxide and tin oxide in the following atomic ratios:

In/(In+Zn+Sn)=0.80 to 1.00,

Zn/(In+Zn+Sn)=0.00 to 0.20,

Sn/(In+Zn+Sn)=0.00 to 0.20, and contains from 0.5 to 10 atomic %, relative to the total of all metal atoms therein, of a metal oxide selected from ruthenium oxide, molybdenum oxide and vanadium oxide.

6. A transparent electroconductive film prepared by coating the surface of a transparent resin film with a transparent electroconductive layer that comprises indium oxide, zinc oxide and tin oxide in the following atomic ratios:

In/(In+Zn+Sn)=0.80 to 1.00,

Zn/(In+Zn+Sn)=0.00 to 0.20,

Sn/(In+Zn+Sn)=0.00 to 0.20,

TABLE IV-6

| Example | Target Code | Substrate Temperature (° C.) | Specific Resistance of Film (mΩ · cm) | Light Transmittance (%) | Crystallinity | Work Function (eV) |
|---|---|---|---|---|---|---|
| IV-17 | [O] | 25 | 45 | 81 | amorphous | 5.51 |
| IV-18 | [P] | 25 | 42 | 82 | crystalline | 5.48 |
| IV-19 | [Q] | 25 | 6 | 81 | amorphous | 5.47 |
| IV-20 | [R] | 25 | 2 | 80 | amorphous | 5.52 |
| IV-21 | [R] | 215 | 1 | 82 | amorphous | 5.49 |
| IV-22 | [R] | 25 | 2 | 80 | amorphous | 5.52 |
| IV-23 | [S] | 25 | 2 | 81 | amorphous | 5.51 |

INDUSTRIAL APPLICABILITY

As described hereinabove, the invention provides sintered products for transparent electroconductive films, which are and contains from 0.5 to 10 atomic %, relative to the total of all metal atoms therein, of a metal oxide selected from ruthenium oxide, molybdenum oxide and vanadium oxide.

7. A transparent electroconductive material of a composition that comprises one or more metal oxides selected from indium oxide, zinc oxide and tin oxide and contains from 0.5 to 20 atomic %, relative to the total of all metal atoms therein, of one or more metal oxides selected from iridium oxide, rhenium oxide and palladium oxide.

8. A transparent electroconductive material of a composition that comprises metal oxide (s) of indium oxide, zinc oxide and tin oxide in the following atomic ratios:

In/(In+Zn+Sn)=0.75 to 0.95,

Zn/(In+Zn+Sn)=0.05 to 0.20,

Sn/(In+Zn+Sn)=0.00 to 0.20, and contains from 0.5 to 20 atomic %, relative to the total of all metal atoms therein, of one or more metal oxides selected from iridium oxide, rhenium oxide and palladium oxide.

9. A sintered product prepared by sintering the composition of claim 7.

10. A sputtering target comprising the sintered product of claim 9.

11. Transparent electroconductive glass prepared by coating the surface of glass with a transparent electroconductive film of a composition that comprises one or more metal oxides selected from indium oxide, zinc oxide and tin oxide and contains from 0.5 to 20 atomic %, relative to the total of all metal atoms therein, of one or more metal oxides selected from iridium oxide, rhenium oxide and palladium oxide.

12. A transparent electroconductive film prepared by coating the surface of a transparent resin film with a transparent electroconductive layer that comprises one or more metal oxides selected from indium oxide, zinc oxide and tin oxide and contains from 0.5 to 20 atomic %, relative to the total of all metal atoms therein, of one or more metal oxides selected from iridium oxide, rhenium oxide and palladium oxide.

13. A transparent electroconductive material of a composition that comprises metal oxide (s) of tin oxide, indium oxide and zinc oxide in the following atomic ratios:

Sn/(Sn+Zn+Sn)=0.60 to 0.95,

In/(Sn+In+Zn)=0.00 to 0.35,

Zn/(Sn+In+Zn)=0.05 to 0.20, and contains from 0.5 to 10 atomic %, relative to the total of all metal atoms therein, of one or more metal oxides selected from vanadium oxide, molybdenum oxide and ruthenium oxide.

14. A sintered product prepared by sintering the composition of claim 13 at a temperature of not lower than 1200° C.

15. Transparent electroconductive glass prepared by forming, on the surface of a glass substrate, a transparent electroconductive film of a composition that comprises metal oxide(s) of tin oxide, indium oxide and zinc oxide in the following atomic ratios:

Sn/(Sn+In+Zn)=0.55 to 1.00,

In/(Sn+In+Zn)=0.00 to 0.45,

Zn/(Sn+In+Zn)=0.00 to 0.25, and contains from 0.5 to 10 atomic %, relative to the total of all metal atoms therein, of one or more metal oxides selected from vanadium oxide, molybdenum oxide and ruthenium oxide.

16. A transparent electroconductive film prepared by forming, on the surface of a transparent resin film, a transparent electroconductive layer of a composition that comprises metal oxide (s) of tin oxide, indium oxide and zinc oxide in the following atomic ratios:

Sn/(Sn+In+Zn)=0.55 to 1.00,

In/(Sn+In+Zn)=0.00 to 0.45,

Zn/(Sn+In+Zn)=0.00 to 0.25, and contains from 0.5 to 10 atomic %, relative to the total of all metal atoms therein, of one or more metal oxides selected from vanadium oxide, molybdenum oxide and ruthenium oxide.

17. The sintered product prepared by sintering the composition of claim 8.

18. A sintered product according to claim 1, wherein the metal oxide is ruthenium oxide.

19. A sintered product according to claim 1, wherein the metal oxide is molybdenum oxide.

20. A sintered product according to claim 1, wherein the metal oxide is vanadium oxide.

21. A transparent electroconductive material according to claim 7, wherein the metal oxide is iridium oxide.

22. A transparent electroconductive material according to claim 7, wherein the metal oxide is rhenium oxide.

23. A transparent electroconductive material according to claim 7, wherein the metal oxide is palladium oxide.

* * * * *